United States Patent
Otsuka et al.

(10) Patent No.: US 7,190,188 B2
(45) Date of Patent: Mar. 13, 2007

(54) SIGNAL TRANSMISSION SYSTEM, AND SIGNAL TRANSMISSION LINE

(75) Inventors: Kanji Otsuka, 2-1074-38 Kohan, Higashiyamato-shi, Tokyo (JP); Tamotsu Usami, 2-38-4 Nishimachi, Kokubunji-shi, Tokyo (JP)

(73) Assignees: Kanji Otsuka, Tokyo (JP); Tamotsu Usami, Tokyo (JP); Sony Corporation, Tokyo (JP); Oki Electric Industry Co., Ltd., Tokyo (JP); Sanyo Electric Co., Ltd., Osaka (JP); Kabushiki Kaisha Toshiba, Tokyo (JP); NEC Corporation, Tokyo (JP); Sharp Kabushiki Kaisha, Osaka (JP); Renesas Technology Corp., Tokyo (JP); Matsushita Electric Industrial Co., Ltd., Osaka (JP); Fujitsu Limited, Kanagawa (JP); Rohm Co., Ltd., Kyoto (JP)

( * ) Notice: Subject to any disclaimer, the term of this patent is extended or adjusted under 35 U.S.C. 154(b) by 166 days.

(21) Appl. No.: 10/898,874

(22) Filed: Jul. 26, 2004

(65) Prior Publication Data

US 2005/0040846 A1 Feb. 24, 2005

(30) Foreign Application Priority Data

Jul. 28, 2003 (JP) .......................... P2003-281188

(51) Int. Cl.
*H03K 17/16* (2006.01)
*H03K 19/003* (2006.01)

(52) U.S. Cl. ............................. 326/30; 326/32; 326/33
(58) Field of Classification Search ............ 326/30–34
See application file for complete search history.

(56) References Cited

U.S. PATENT DOCUMENTS

2001/0013075 A1* 8/2001 Otsuka et al. ................. 710/33

* cited by examiner

*Primary Examiner*—Anh Q. Tran
(74) *Attorney, Agent, or Firm*—Sonnenschein Nath & Rosenthal LLP

(57) ABSTRACT

To transmit a high-speed digital signal of several tens GHz via a differential line by connecting a differential line referring to the ground to differential lines not referring to the ground, there is provided a signal transmission system which transmits a digital signal between circuit blocks via a signal transmission line, each of the circuit blocks basically including a functional circuit, a reception/transmission circuit formed separately from the functional circuit and an impedance-matched transmission line (115) formed between reception and transmission ends of the reception/transmission circuit; a differential line (105) referring to the ground (110), led out from a differential output driver, being formed from differential signal lines disposed symmetrically with respect to the ground (110) in the circuit block, only differential pair lines (111, 112) not referring to the ground being extended directly from the differential signal lines disposed symmetrically with respect to the ground in the signal transmission line (115).

9 Claims, 34 Drawing Sheets

DIRECTION OF FIELD E

BOUNDARY BS OF DIELECTRIC

DIRECTION OF FIELD E

BOUNDARY BS OF DIELECTRIC

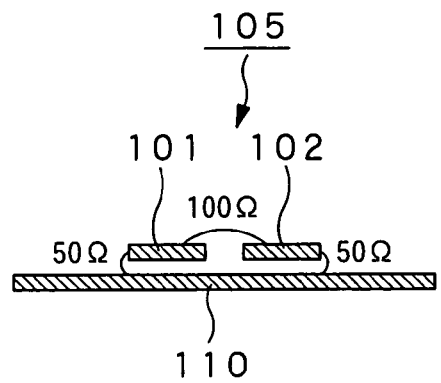
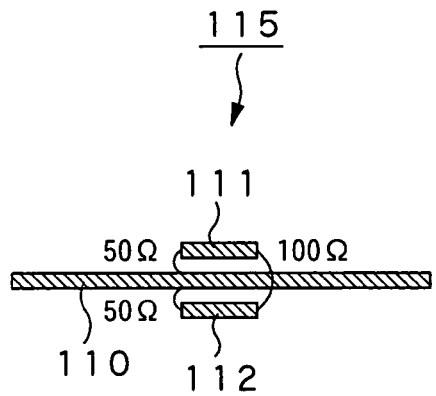
FIG.34A  FIG.34B
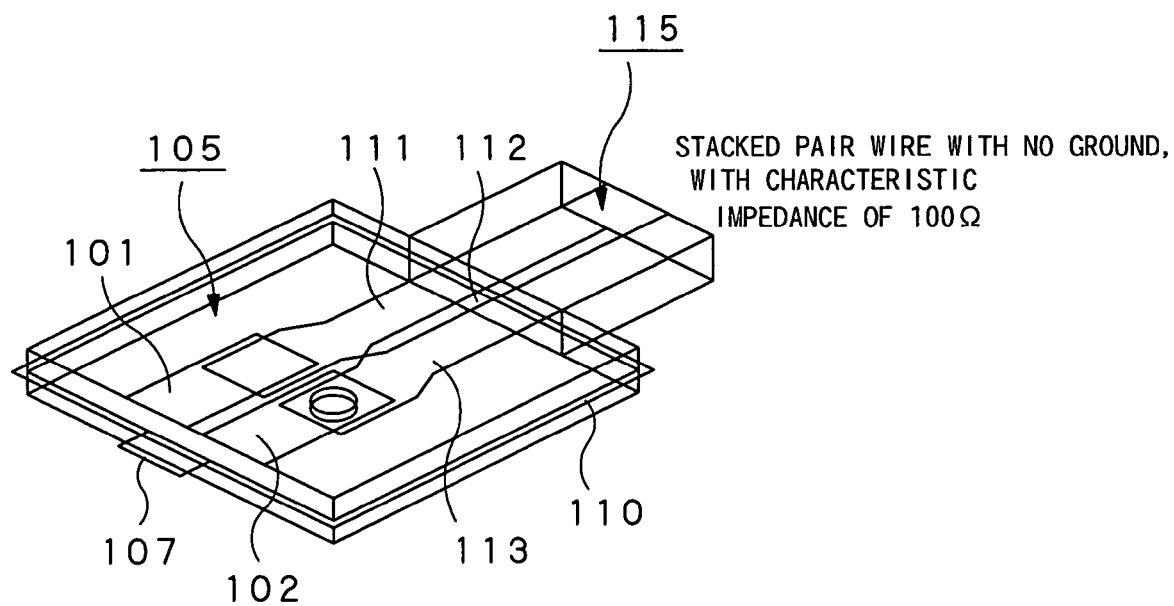
FIG.35

SIGNAL TRANSMISSION SYSTEM, AND SIGNAL TRANSMISSION LINE

BACKGROUND OF THE INVENTION

1. Field of the Invention

The present invention relates to a signal transmission system for transmission of digital signals between circuit blocks via a signal transmission line, and to the signal transmission line.

This application claims the priority of the Japanese Patent Application No. 2003-281188 filed on Jul. 28, 2003, the entirety of which is incorporated by reference herein.

2. Description of the Related Art

For a high-speed transmission of digital signals from a CMOS differential driver to a receiver via a signal line, the Inventors of the present invention proposed, before the present invention, to have a power/ground wire pair function as a transmission line whose electromagnetic field is almost closed against a complementary signal energy to be supplied to the driver by forming a power wire and grounding wire formed on a wiring circuit board into a pair wire structure formed from parallel wires equal in length to each other and whose coupling coefficient is large (cf. Japanese Published Unexamined Patent Application No. 284126 of 1999 (will be referred to as a patent document 1)), and enabling a high-speed switching of a transistor by providing a circuit to forcibly pump up and down the necessary charge for state transition of the transistor (cf. Japanese Published Unexamined Patent Application No. 2002-124635 (will be referred to as a patent document 2)).

Note here that for transmission of an electric energy, there should basically used two power lines such as the domestic electric power line. The power line has a conductance similar to that of a water pipe, proportional to the thickness of the latter. The reciprocal of this conductance is called "characteristic impedance Zo".

The physics of the pipe thickness corresponds to an energy stored in an inductance Lo and capacitance Co per unit length of the power line. Since the energy input and output are made more frequently as its frequency is higher, an alternate-current (AC) resistance, namely, an impedance Z, will take lace. The impedance Z is discharged with a time lag and without loss of the energy, differently from an element for conversion of electric energy into heat energy, such as a direct-current resistor and a leakage conductance between pair wires. Thus, the impedance Z is handled as an imaginary number. The impedance Z is given by the following equations (1) and (2):

$$Z = j\omega Lo \quad (1)$$

$$Z = (1/j\omega Co) \quad (2)$$

As shown in the above equations (1) and (2), since two elements are coexistent per unit length in the line, the mean square of them is a characteristic impedance Zo of the line, which is given by the following equation (3):

$$Zo = \sqrt{j\omega Lo / j\omega Co} = \sqrt{Lo/Co} \quad (3)$$

As shown in the above equation (3), three terms including the imaginary number j, angular frequency ω and unit length are eliminated and thus the characteristic impedance Zo will be a real number not defined in length and which does not depend upon any frequency. There is arisen a special physical concept that both a short line and infinitely long one will be equal in characteristic impedance Zo to each other. Briefly, the characteristic impedance Zo determines only the front-end diameter of the line.

As a universal misunderstanding in the domain of the lumped-element circuit, it has been said heretofore that since the transmission line is an inductance-capacitance (LC) network, the RC (resistance-capacitance) delay problem cannot substantially be avoided unless the LC network is considered from the standpoint of a distributed-element circuit. However, the transmission line belongs to the field of electromagnetic phenomenological physics, quite different from a field in which the RC delay is involved. It will be discussed herebelow that the RC delay problem can be solved for the transmission line.

A distributed-element circuit (having the long-distance wiring thereof defined in length) is differentiated from a lumped-element circuit (having the wire length in a negligible range) as given by the following equation (4) (cf. "Silicon Technology"—Feature of the Problems and Outlook of the Ultra High-Speed Multilayer Wiring Techniques—Journal of Applied Physics, Japan Society of Applied Physics, Japan, No. 15, Feb. 18, 2000 (Yamagami Clubhouse, Higashiyama (will be referred to as a non-patent document 1)):

$$L_{critical} = \lambda/40 = co\sqrt{\mu r \in r}/40 f_{clock} \quad (4)$$

where co is a speed of light in vacuum, μr is a specific permeability, ∈r is a specific dielectric constant and $f_{clock}$ is a highest frequency of a clock pulse flowing through the wire.

The above equation (4) defines the relation between the wavelength λ of a sine wave and the wire length $L_{critical}$.

The factor (1/40) in the equation (4) will be explained below concerning its meaning with reference to FIG. 1.

As shown in FIG. 1, a digital (pulse) signal is a complex wave $f_{combine}$ including a fundamental wave $f_1$ and its harmonics $f_2$, $f_3$ . . . . Addition of the harmonic $f_3$ having a frequency three times higher than that of the fundamental wave $f_1$ and harmonic $f_5$ having a frequency five times higher than that of the fundamental wave $f_1$ forms an approximate pulse, and addition of the harmonics $f_7$, $f_9$ and $f_{11}$, having frequencies seven times, nine times and eleven times, respectively, higher than that of the fundamental wave $f_1$ provides a nearly complete pulse. In other words, the pulse can be said to be a mixed wave including up to a harmonic of a sine wave one order of magnitude higher than the pulse frequency thereof. Therefore, for a pulse of 1 GHz, it is necessary to take up to a harmonic of 10 GHz into consideration. Like a tuning fork, the resonance leads to a minimum resonant frequency equal to a quarter of a wavelength (that is (1/4)λ).

Therefore, for transmission of a pulse of 1 GHz in frequency, a lumped-element circuit can conventionally be designed to have a length of up to a quarter of the wavelength of a pulse of 10 GHz, namely, to a length less than 1/40 of the wavelength plus a safety length. This circuit length, by which a distributed-element circuit and lumped-element circuit is differentiated from each other, is defined as a wire length $L_{critical}$. Namely, a circuit having a length of more than (1/40)λ should be a distributed-element circuit, namely, a transmission circuit.

As an example of a conventional driver-receiver circuit with a global wire whose length cannot be neglected, a single-ended digital signal transmission circuit 300 is illustrated in FIG. 2.

Although there is shown only a single signal line in FIG. 2 for the simplicity of illustration, the digital signal transmission circuit 300 actually needs two such lines for transmission of an electric energy according to the physical principle. A grounding wire not intentionally formed for reference, or a power line, serves as the second signal line.

In the single-ended digital signal transmission circuit 300, a signal line 311 led out from a driver 310 is paired with a grounding wire 312 to form a signal transmission line 315 via which a complementary signal will be transmitted from the driver 310 to a receiver 320 (cf. "Measurement Evidence of Mirror Potential Traveling on Transmission Lines" by Otsuka, et al., Technical Digest of 5th VLSI Packing Workshop of Japan, pp 27–28, December, 2000 (will be referred to as a non-patent document 2) and "Stacked Pair Wire" by Kanji Otsuka and Tadakazu Suga, Journal of Japan Society of Electronics Packaging, Vol.4, No. 7, pp 556–561, November, 2001 (will be referred to as a non-patent document 3)).

Also, as examples of a conventional differential digital signal transmission circuit an constructional example of a CML (current mode logic) differential transmission circuit 400 is illustrated in FIG. 3 and a constructional example of an LVDS (low voltage differential signaling) differential transmission circuit 500 is illustrated in FIG. 4.

In the differential digital signal transmission circuit 400 (500) constructed as shown in FIG. 3 (4), a complementary signal is transmitted from driver 410 (510) to a receiver 420 (520) via a signal transmission line 415 (515) paired with a grounding wire.

The differential digital signal transmission circuit is said to be suitable for high-speed data transmission, and recently it is frequently used for high-speed transmission of differential signals.

Note here that the signal transmission circuit using a pulse clock having a frequency included in the GHz frequency band has the wire length thereof limited because the wire cannot be long against an RC delay and loss and a dielectric loss. On the other hand, a loner wire is more and more important for communications between functional blocks of a signal transmission circuit. For example, a LAN cable formed from metal conductors is required to assure a signal transmission at a rate as high as 10 Gbps and 100 Gbps. Signal transmission at a rate higher than 10 Gbps over a distance shorter than 100 meters cannot be done by the metal LAN cable but can be done by the optical cables available in the year 2003.

OBJECT AND SUMMARY OF THE INVENTION

The present invention has an object to provide a signal transmission system including, in a set, a wire whose length is larger than the wire length $L_{critical}$ as defined in the aforementioned equation (4) and the driver/receiver circuit formed by that wire, and which uses a clock frequency in a GHz band up to several tens GHz.

The present invention has another object to provide a measure for improvement of mainly the middle-length wires for transmission rates of 10 and 100 Gbps, and also an improved circuit configuration of the signal transmission system.

Also the present invention has another object to build up a transmission line/transistor system in which an entire circuit in a chip, having a long wire or line, is used as a transmission line to assure a trouble-free energy transmission, which could conveniently be explained by making the analogy of a waterworks department's pipe/valve system including a channel for intake of water from a river. The "long wire or line" will be defined in Table 1 which defines "long wires or lines" according to an electromagnetic wave velocity v given by $v=co/\sqrt{\mu r \in r}$ where co is a speed of light in vacuum, µr is a specific permeability of an insulative material surrounding the space of a line, $\in r$ is a specific dielectric constant of the insulative material surrounding the space of the line.

TABLE 1

Frequency vs. Minimum Due Length of Intra-chip Wire for Transmission Line

| Pulse frequency [MHz] | Sine wave Harmonic [GHz] | Wire length [m] of $(1/4)\lambda$ when v = $1 \times 10^8$ [m/s] | Wire length [m] of $(1/4)\lambda$ when v = $1.5 \times 10^8$ [m/s] | Wire length [m] of $(1/4)\lambda$ when v = $2 \times 10^8$ [m/s] |
|---|---|---|---|---|
| 5 | 0.05 | 0.5 | 0.75 | 1 |
| 10 | 0.1 | 0.25 | 0.375 | 0.5 |
| 50 | 0.5 | 0.05 | 0.075 | 0.1 |
| 80 | 0.8 | 0.03125 | 0.0375 | 0.0625 |
| 100 | 1 | 0.025 | 0.0375 | 0.05 |
| 300 | 3 | 0.008325 | 0.0012485 | 0.01665 |
| 500 | 5 | 0.005 | 0.0075 | 0.01 |
| 1000 (1 GHz) | 10 | 0.0025 | 0.00375 | 0.005 |
| 10000 (10 GHz) | 100 | 0.00025 | 0.000375 | 0.0005 |
| 100 GHz | 1000 | 25 µm | 37.5 µm | 50 µm |

Note here that the transmission between circuit blocks is done by the packet transmission for serial transmission of signals and by the bus transmission for parallel transmission of signals, both being essentially based on the concept of transmission of a high-frequency pulse signal energy. Therefore, the present invention stands on the concept of high-speed signal transmission, not on any protocol-based signal transmission. The present invention provides a means applicable to all signal transmission methods.

In the driver, there is normally included a CMOS inverter as a basic circuit. According to the present invention, the signal transmission system is formed from a simplest inverter and buffer without having to use any new circuit and manufacturing process. The signal transmission system is thus usable without the necessity of any modification even with any technical innovations.

According to the present invention, the transmission line used like a distributed-element circuit is used for wiring between circuit blocks. Thus, it is possible to design a signal transmission system in which the delay time depends upon the length of the transmission line alone and the clock of a signal having a bit width (64 bits, for example) is little skewed, and to share a clock wire with a skew of less than several ps by forming the clock wire in the form of an H-tree transmission line.

An ideal transmission line is such that since an electromagnetic energy is confined therein, a slowdown appearing in an integrated circuit, which appears as an RC delay, will be zero. The signal energy is lost due to a DC resistance and dielectric loss of the transmission line, so that the maximum amplitude will be lower according to the Ohm's law. However, since the signal energy loss due to the DC resistance will not spoil the signal waveform, the RC delay is negligibly small. When the lines in a bit width are identical in structure and dimensions to each other, the skew will substantially be zero.

However, since the dielectric loss has an influence on the frequency response, the waveform will be disturbed. But if the lines in the bit width are identical in structure to each other and the waveform disturbance is constant, the signal waveform can be controlled appropriately.

The power source is a problem in many cases. If the inverters are different in power supply capability and ground attraction from each other, they can only be switched correspondingly to the power supply capability so that the signal waveform will vary from one to another. Thus, a skew will take place and also an extra harmonic is superposed on the signal, resulting in a phenomenon unique to a resonance. This is a more critical problem rather than a characteristic variation caused in the GHz band by a device structure position.

According to the present invention, a transmission line between circuit blocks is usable as a transmission wire and also a transmission line is formed from a pair of power and grounding wires having a characteristic impedance corresponding to an increased resistance at which a driver transistor is turned on.

There have been proposed various transmission line structures in which an electromagnetic energy is confined. However, there are not available so many effective means for preventing a possible crosstalk between the transmission line and a wire, if any, laid adjacent to the transmission line.

The present invention has another object to provide a wiring structure, connector structure and a means for providing a connection with a conventional circuit, in which in which the crosstalk between a line and a structure laid adjacent to the line.

Note here that the transmission line can be said to be a water pipe having a fixed thickness and thus an energy reflection will take place at a discontinuity of the line. The energy reflected at the discontinuity will possibly be reflected again at a discontinuity at the side to which the reflected energy goes back, and the reflected components of the energy will further be reflected repeatedly (multi-reflection) and thus resonate with each other, which will result in a waveform that can never be expected.

On this account, the prevent invention is designed to prevent the energy reflection while cutting off the DC current on the assumption that the transmission line is uniformly thick from the leading to trailing end, that is, the characteristic impedance is uniform through the line.

The above reflection can be prevented by four well-known methods. One of the methods is to insert a damping resistor used in many printed circuit boards at the end of a driver. The second method is to design the driver-on resistance to be the same as the characteristic impedance of the transmission line. The third method is to design the drive-on resistance at either side of a bidirectional bus structure (also, a structure having a damping resistor incidentally inserted at either side thereof) to the same as that in the transmission line. The fourth method is an ideal method. This method is to provide a matched terminating resistor at the reception trailing end of the transmission line. The fourth method is not advantageous in that an on current always flows through the transmission line, and thus it has not well been accepted.

The present invention proposes a fifth method in which a terminating resistor is provided at the trailing end of the transmission line with a directional coupler or capacitor being laid between the resistor and the trailing end.

Further, according to the present invention, a flat device structure and a wiring layer structure, in which a structure extending from an inverter or buffer to a wire is formed as a complete transmission line between the beginning and trailing ends thereof, and a DC energy, if applied, is cut off at either end of the transmission line. It should be noted that the structure also includes a generally used ground structure for a differential signal.

Normally, a differential signal flows on a pair wire. Conventionally, a differential digital signal transmission circuit is a transmission line formed taking account of grounding in order to attain coincidence in reference voltage level between devices and thus it has a three-phase AC wiring. Therefore, a terminating resistor has to be provided for a coupling coefficient for the transmission line, which however has not been carefully considered in many cases.

Also, since a circuit operation causes the power supply/grounding to vary largely, which will adversely affect the adjacent circuits. To prevent such an influence, it is absolutely necessary in signal processing in the GHz frequency band to provide a power supply/grounding separately for each of circuit blocks. The present invention is also directed to solution of this program.

The differential transmission circuit has another disadvantage that a differential signal itself incurs a skew because of a variation in performance from one transistor to another and the skew will cause a large spike current during transition of the differential signal, causing an EMI problem. The differential transmission circuit is also not advantageous in that a double number of transistors are required.

The design guide for the flat device structure and wiring layer structure according to the present invention is begins with a transmission circuit capable of a transmission at an electromagnetic wave velocity. Therefore, the transistor location is not any main purpose, but a subordinate purpose, of the design guide.

That is to say, a metal transmits a signal at an electromagnetic wave velocity. But a semiconductor transmits a signal at a carrier velocity, not at the electromagnetic wave velocity. On this account, all lines from contacts of a transistor are formed from a metal, not from any polysilicon or metal compound (e.g., silicide). The gate of the transistor is also from the metal, whereby the transmission circuit can be a complete transmission line extending from the beginning to trailing end.

The above middle-range wire constructed as above can build up an interblock transmission system capable of transmitting a frequency of several GHz over a distance of 50 meters and satisfactorily accommodating the future switching capability of an inverter and buffer.

Also in the signal transmission system for transmission of digital signals between the circuit blocks via the signal transmission line, there is generally provided a protection diode or transistor at each of the input and output ends to assure protection against electrostatic discharge (ESD). The parasitic capacitance of the protection diode or transistor will be such a hindrance to the quick response to a signal transition that the signal transmission system cannot be addressed to high-frequency signals.

On this account, the present invention proposes a varactor circuit to reduce the apparent capacitance of an ESD (electrostatic discharge) protection circuit.

Typical ones of the embodiments of the present invention disclosed in this application will briefly be described below:

According to one aspect of the present invention, there is provided a signal transmission system which transmits a digital signal between circuit blocks via a signal transmission line, each of the circuit blocks basically including a functional circuit, a reception/transmission circuit formed separately from the functional circuit and an impedance-matched transmission line formed between reception and transmission ends of the reception/transmission circuit, the system including a differential line referring to the ground, led out from a differential output driver and formed from differential signal lines disposed symmetrically with respect to the ground in the circuit block, only differential pair lines not referring to the ground being extended directly from the differential signal lines disposed symmetrically with respect to the ground in the signal transmission line.

According to another aspect of the present invention, there is provided a signal transmission system which transmits a digital signal between circuit blocks via a signal transmission line, each of the circuit blocks basically including a functional circuit, a reception/transmission circuit formed separately from the functional circuit and an impedance-matched transmission line formed between reception and transmission ends of the reception/transmission circuit, each of the reception/transmission circuits including a driver and/or receiver having formed in the same conductive area thereof an ESD protection circuit having a pull-up protection circuit and pull-down protection circuit, respectively, for each differential signal line, and which activates an ESD protection transistor in a complementary manner.

According to a still another aspect of the present invention, there is provided a signal transmission system which transmits a digital signal between circuit blocks via a signal transmission line, each of the circuit blocks basically including a functional circuit, a reception/transmission circuit formed separately from the functional circuit and an impedance-matched transmission line formed between reception and transmission ends of the reception/transmission circuit, the signal transmission line having a multi-core cable structure in which adjacent differential or single-ended pair lines are laid so that electric field vectors they generate will go side by side or straight.

According to a yet another aspect of the present invention, there is provided a signal transmission line for providing a connection between circuit blocks each including a functional circuit, a reception/transmission circuit formed separately from a functional circuit and an impedance-matched transmission line laid between reception and transmission ends of the reception/transmission circuit to transmit a digital signal between the circuit blocks, the signal transmission line having a multi-core cable structure in which adjacent differential or single-ended pair lines are laid so that electric field vectors they generate will go side by side or straight.

In the above signal transmission system according to the present invention, the driver and/or receiver included in each of the reception/transmission circuits having formed in the same conductive area thereof an ESD protection circuit having a pull-up protection circuit and pull-down protection circuit, respectively, for each differential signal line, and which activates an ESD protection transistor in a complementary manner.

Also in the signal transmission system according to the present invention, the signal transmission line has a multi-core cable structure in which adjacent differential or single-ended pair lines are laid so that electric field vectors they generate will go side by side or straight.

Also in the signal transmission system according to the present invention, the reception/transmission circuit including a power/ground pair transmission line has at least one of a reception circuit or transmission circuit, both included in the reception/transmission circuit, embedded in a connector to supply a power from a substrate.

Also in the signal transmission system according to the present invention, the reception/transmission circuit includes a driver having a differential inverter structure which outputs a digital signal. The reception/transmission circuit is extended to a main power circuit or proximity bypass capacitor, and has a DC-insulation structure in which the driver is supplied with a power via a power/ground pair line having a low characteristic impedance and capable of driving a sum of characteristic impedance of an on resistor of the driver and the signal transmission line and a directional coupler or capacitor is inserted at least either just after the driver or at the reception end. In case the reception/transmission circuited is further extended by a transmission line, if any, a digital signal for transmission via the signal transmission line terminated in the traveling direction of the directional coupler or capacitor is received by a differential receiver having a threshold voltage Vth corresponding to the level of an arriving signal just after or before the directional coupler or capacitor.

Also in the signal transmission system according to the present invention, a transistor to be in pair with the differential driver or receiver is provided in the same well and it has a floating structure without connection to the substrate ground. All the aforementioned transmission lines are formed from a metal.

Also in the signal transmission system according to the present invention, a set of a power/ground pair line, driver, signal transmission line and a receiver is provided bidirectionally.

Also in the signal transmission system according to the present invention, both ends of the pair line is a floating open end and even a grounding wire of the directional coupler or capacitor just after the driver chip and that just before or after the receiver chip is not connected directly to the ground.

Also in the signal transmission system according to the present invention, an energy-pass side line of the directional coupler or capacitor has a multireflection-preventive terminating resistor inserted at the transmission trailing end thereof.

Also in the signal transmission system according to the present invention, an electrode is inserted between the differential pair lines at the end of a receiver which receives a digital signal via the signal transmission line, and the potential at the electrode is taken as a reference voltage.

Also in the signal transmission system according to the present invention, in case the reception/transmission circuit in one of the circuit blocks that transmits a digital signal via the signal transmission line has no power source, power/ground pair transmission lines run side by side, and the characteristic impedance of the power/ground pair transmission lines is equal to or smaller than a parallel impedance of a plurality of signal transmission lines to be driven.

In the above signal transmission system which transmits a digital signal between circuit blocks via a signal transmission line, each of the circuit blocks basically including a functional circuit, a reception/transmission circuit formed separately from the functional circuit and an impedance-matched transmission line formed between reception and transmission ends of the reception/transmission circuit, the system including a differential line referring to the ground, led out from a differential output driver and formed from differential signal lines disposed symmetrically with respect to the ground in the circuit block and only differential pair lines not referring to the ground being extended directly from the differential signal lines disposed symmetrically with respect to the ground in the signal transmission line, whereby a differential line referring to the ground can be connected to the differential lines not referring to the ground to permit transmission of a high-speed digital signal of several tens GHz via the differential line.

Also in the above signal transmission system which transmits a digital signal between circuit blocks via a signal transmission line, each of the circuit blocks basically including a functional circuit, a reception/transmission circuit formed separately from the functional circuit and an impedance-matched transmission line formed between reception and transmission ends of the reception/transmission circuit, each of the reception/transmission circuits including a driver and/or receiver having formed in the same conductive area thereof an ESD protection circuit having a pull-up protection circuit and pull-down protection circuit, respectively, for each differential signal line, and which activates an ESD protection transistor in a complementary manner, whereby a high-speed digital signal of several tens GHz can be transmitted via the differential line by improving the response to a signal transition through reduction of the apparent capacitance of the ESD protection circuit.

Also in the above signal transmission system which transmits a digital signal between circuit blocks via a signal transmission line, each of the circuit blocks basically including a functional circuit, a reception/transmission circuit formed separately from the functional circuit and an impedance-matched transmission line formed between reception and transmission ends of the reception/transmission circuit, the signal transmission line having a multi-core cable structure in which adjacent differential or single-ended pair lines are laid so that electric field vectors they generate will go side by side or straight, whereby a high-speed digital signal of several tens GHz can be transmitted via the differential line with minimization of a crosstalk between lines adjacent to other structures.

Also in the above signal transmission line including a functional circuit, a reception/transmission circuit formed separately from a functional circuit and an impedance-matched transmission line laid between reception and transmission ends of the reception/transmission circuit, the signal transmission line having a multi-core cable structure in which adjacent differential or single-ended pair lines are laid so that electric field vectors they generate will go side by side or straight, whereby it is possible to provide a signal transmission line capable of transmit a high-speed digital signal of several tens GHz with minimization of a crosstalk between lines adjacent to other structures.

These objects and other objects, features and advantages of the present invention will become more apparent from the following detailed description of the preferred embodiments of the present invention when taken in conjunction with the accompanying drawings.

BRIEF DESCRIPTION OF THE DRAWINGS

FIG. 13 shows structures of directional couplers, in which

FIG. 14 illustrates characteristic curves showing results of simulation made with the directional coupler of Type 1, in which

FIG. 15 illustrates characteristic curves showing results of simulation made with the directional coupler of Type 2, in which

FIG. 16 are waveform charts showing results of input of a pulse wave to the directional coupler of Type 2 provided with an element of 2 pF and an element of 1 MΩ, equivalent to the load of a receiver transistor, connected in parallel to a port 2, in which

FIG. 18 shows a model of a capacitive-coupling line as an example of the capacitive coupler used in the signal transmission system shown in FIG. 8, in which

FIG. 19 illustrates characteristic curves showing results of signal-waveform simulation made with the capacitive-coupling line model in FIG. 18 with a chip capacitor having a capacity of 0.1 µF being used in the model, in which

FIG. 20 illustrates characteristic curves showing results of signal-waveform simulation made with the capacitive-coupling line model in FIG. 18 with a chip capacitor having a different capacity from that of the chip capacitor used in the model in FIG. 19, in which

FIG. 21 illustrates characteristic curves showing results of simulation with a transmission line having tan δ of 0.015, in which

FIG. 23 illustrates characteristic curves showing results of simulation with the twisted-pair wire in FIG. 22, in which

FIG. 24 illustrates perspective views of constructional examples of the transmission line, in which

FIG. 27 schematically illustrates constructional examples in which wires arrayed in the form of a grid to observe a crosstalk between adjacent pair wires, in which

FIG. 29 illustrates characteristic curves showing results of measurement of a crosstalk between adjacent pair wires with input of a high-frequency pulse having a waveform shown in FIG. 28, in which

FIG. 30 illustrates spreading of the electric field whose section is formed circular for explanation why the crosstalk occurs between the adjacent pair wires, in which

FIG. 31 illustrates constructional examples of the pair wire array for less crosstalk, in which

FIG. 34 illustrates connection between a differential transmission line and stacked-pair line, in which FIG. 34A shows the differential transmission line referencing to a grounding wire and FIG. 34B shows a line having a grounding wire inserted between itself and a differential signal line;

FIG. 35 shows connection between a stacked-pair line with no grounding wire and a differential transmission line referencing to the grounding wire;

FIG. 36 shows, in the form of a perspective view, constructional examples of a viahole formed through a flat grounding wire, in which

DETAILED DESCRIPTION OF THE PREFERRED EMBODIMENTS

The present invention will be described in detail concerning the embodiments thereof with reference to the accompanying drawings.

Figure 5:
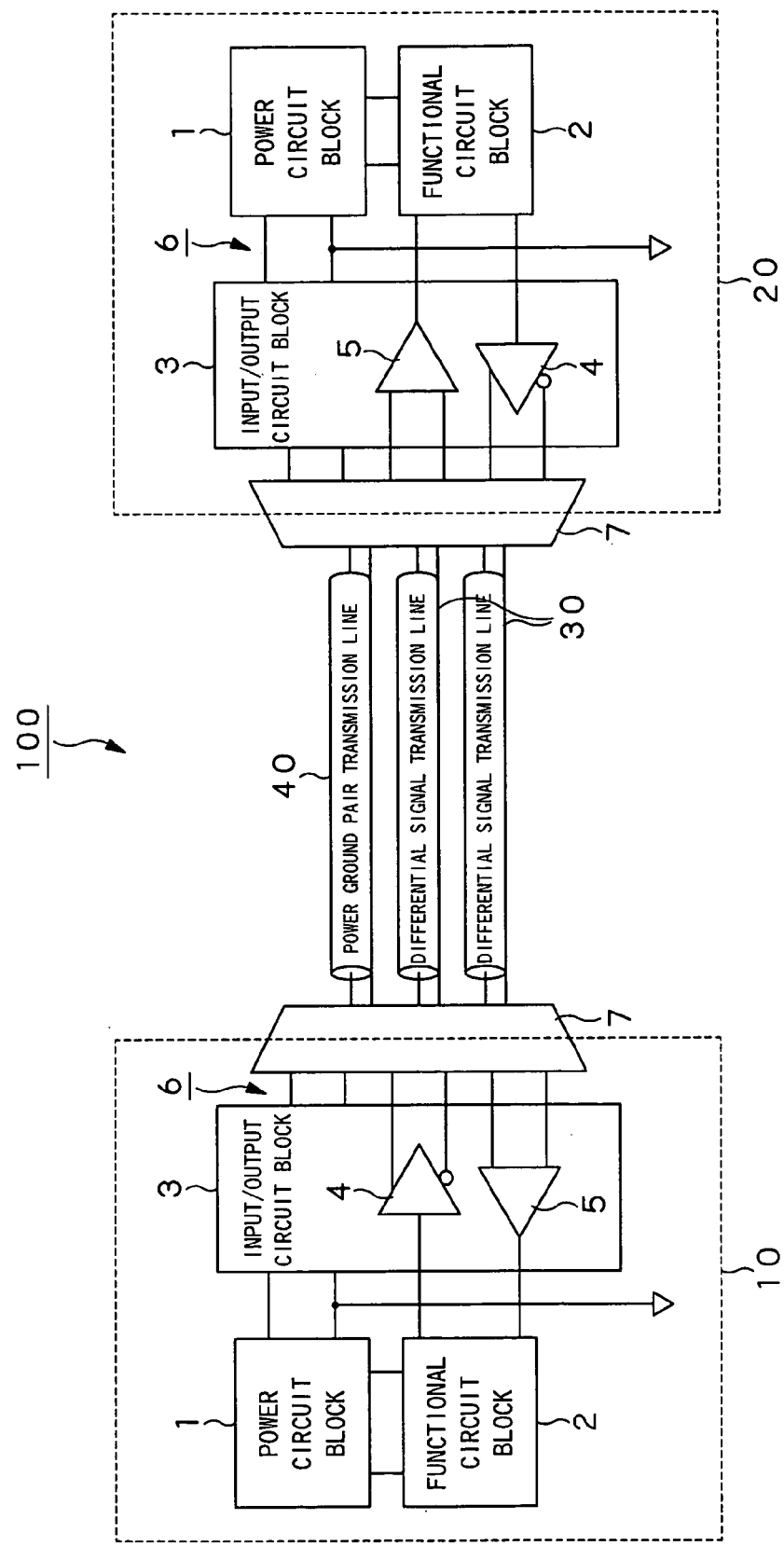
FIG. 5 is a block diagram of the configuration of an inter-circuit block transmission system according to the present invention.

In the embodiments of the present invention, which will be described below, an inter-circuit block transmission system 100 as shown in FIG. 5 is formed by connecting two circuit blocks to each other by a simply-constructed differential signal transmission line on which a conventional single-ended signal is transmitted by differentiating.

The inter-circuit block transmission system 100 includes two circuit blocks 10 and 20 connected to each other by a differential signal transmission line 30 and power/ground pair transmission line 40. Each of the circuit blocks 10 and 20 includes a functional circuit block 2 supplied with a power from a power circuit block 1, an input/output circuit block 3 separated from the functional block 2, and a connector 7 provided at an input/output end of the input/output circuit block 3. The input/output circuit block 3 separated from the functional circuit block 2 includes a plurality of drivers 4 and receivers 5, and a power/ground pair 6. The input/output circuit block 3 may be provided inside the housing of the connector 7.

The differential signal transmission line 30 and power/ground pair transmission line 40 are led out from the connector 7 of the circuit block 10 and connected to the circuit block 20. The circuit block 20 is constructed similarly to the circuit block 10.

Note that the circuit blocks are normally formed separately on a substrate, which may of course be applied to an inter-circuit block transmission system in the same substrate.

Figure 6:
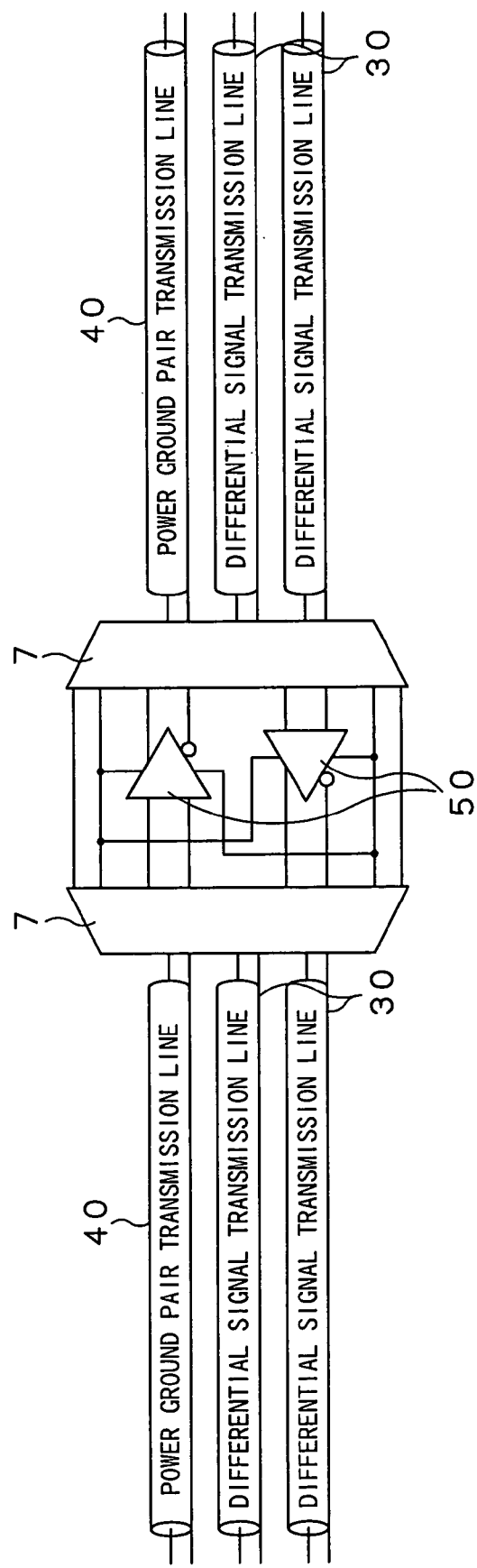
FIG. 6 is a block diagram of a circuit block serving as an interchange circuit including a driver and receiver.

Also, in case the circuit blocks are at so long a distance from each other that a signal energy will be attenuated through the transmission line, a circuit block including a driver and receiver may be formed as a junction circuit 50 as shown in FIG. 6. Since the power/ground pair transmission circuit 40 extends along the signal transmission line 30 in the inter-circuit block transmission system 100, the junction circuit 50 can be formed as above.

Next, the driver and receiver included in the input/output circuit block 3 of the inter-circuit block transmission system 100 will be described in detail.

Constructional examples of the single-ended differential signal transmission circuit incorporating a directional coupler and capacitive coupler are shown in FIGS. 7, 8, 9, 10 and 11. It should be noted that the single-ended differential signal transmission circuit actually includes an electrostatic discharge (ESD) protection circuit but the latter is not illustrated in these Figures for the simplicity of illustration and explanation. The ESD protection circuit will be illustrated and explained in detail later.

First, the single-end differential signal transmission circuit will be explained below with reference to FIGS. 7, 8, 9 and 10.

A signal line from the driver in the first stage of an inverter having a conventional structure forms, in pair with a grounding wire, a transmission line, and when the signal is transmitted, a complementary signal will travel along a signal line and ground as disclosed in the cited non-patent documents 1 and 2. The impedance of the transmission line is normally 50 to 100 ohms. In the inverter, the ground of LSI substrate provides a reference ground. The grounding wire extended from the reference ground is coupled to the signal line during transmission to result in a complementary signal which is different from that at the reference ground. The new complementary signal will to move independently, which physics is a concept any lumped-element circuit could not give birth to. At the reception trailing end, there is provided a differential signal which can be received by a differential receiver.

In short, a MOS transistor in pair with the differential receiver is included in the same well structure, and not connected to the substrate ground. This structure was already proposed as the Japanese Patent Application No. 2002-22708 by the Inventors of the present invention.

When the transmission circuit is electromagnetically closed, it is possible to prevent any noise from taking place during transmission. Even if a common-mode noise, if any, on the signal being transmitted and the signal is deviated from the reference potential, a correct potential difference can be detected in the same well structure. Thus, the signal can correctly be received independently of the ground. However, when it is necessary to prevent any latch-up due to a large vibration, however, each of MOS transistors Tn21 and Tn2 forming a differential pair with a receiver 5A, as indicated with a dotted line in FIGS. 7, 8, 9 and 10, is connected at the back gate thereof to the drain of a current-control MOS transistor Tn23. However, this is not of course necessary in a structure free from latch-up, such as SOI or the like.

Figure 11:
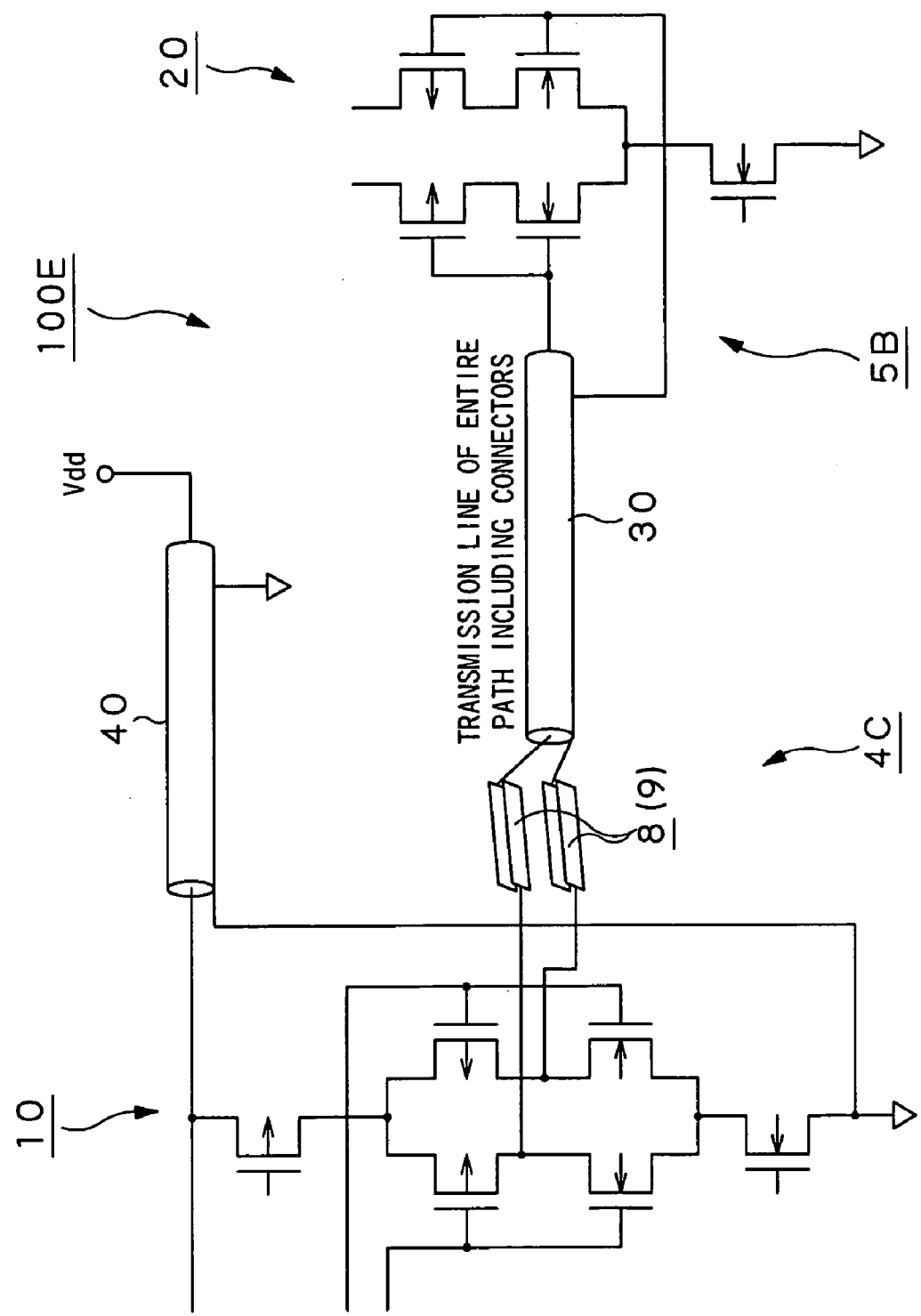
FIG. 11 shows, in the form of a circuit diagram, a constructional example of an LVDS type differentiation circuit.

FIG. 11 shows a single-end differential circuit having no reference ground included in a conventional LVDS differential circuit and which ended by a directional coupler 8 or capacitive coupler 9. A receiver 5B is also provided as shown in FIG. 11, and this receiver 5B may of course be a receiver having a single-ended structure. Also, a single-ended differential circuit having no ECL ground will be illustrated and explained herein, but it will easily be known by analogy that such a circuit can be similarly improved.

Figure 7:
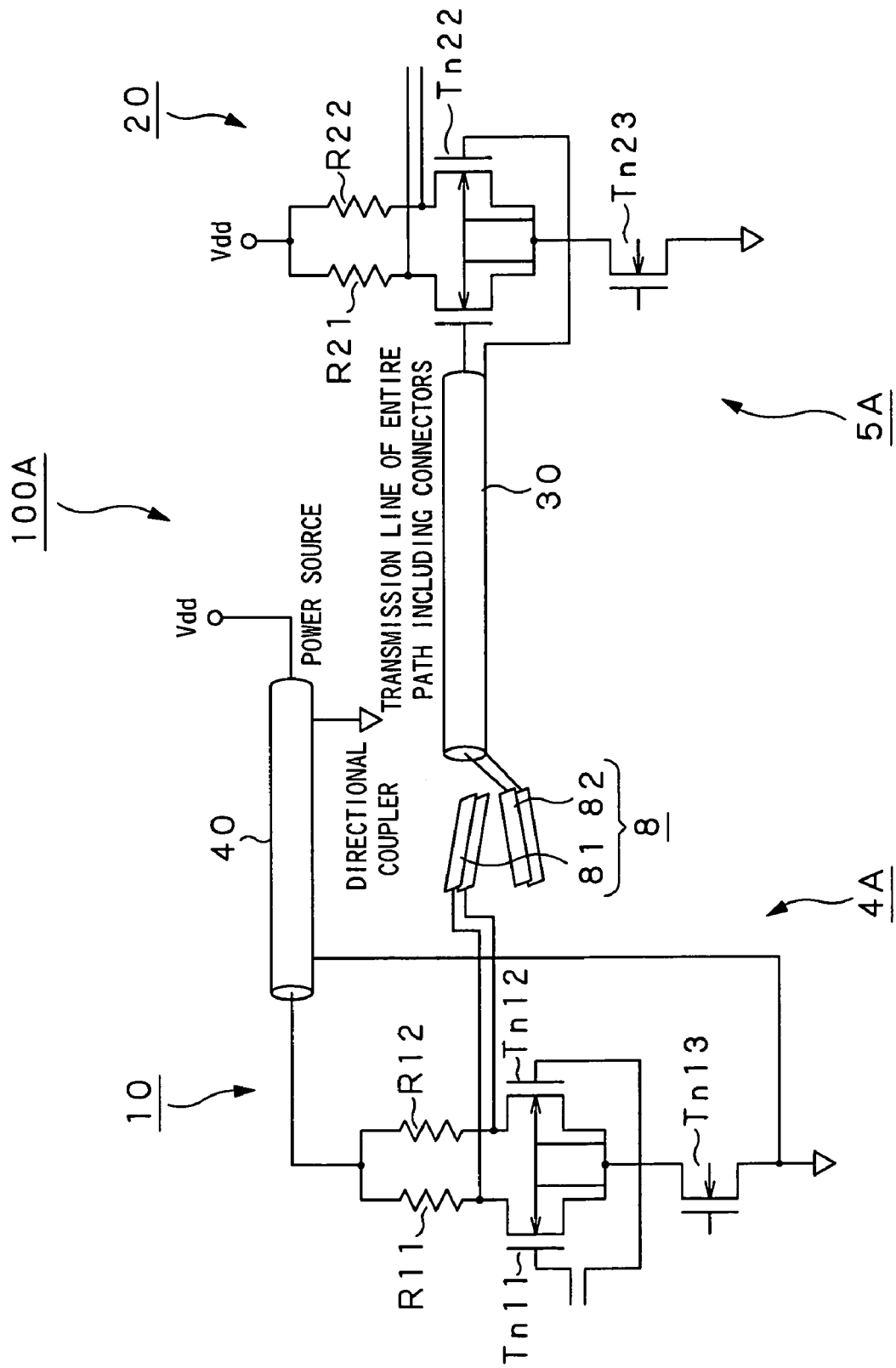
FIG. 7 shows, in the form of a circuit diagram, a constructional example of a signal transmission system with a single coupler at the transmission end.

FIG. 7 shows a constructional example of a signal transmission system 100A with a single coupler provided at the transmission end. As shown, the directional coupler 8 is inserted between a driver 4A of the circuit block 10 and the signal transmission line 30 and the receiver 5A of the circuit block 20 is connected directly to the signal transmission line 30.

The signal transmission line 30 is formed from a pair wire having a length causing an RC delay which is not negligible, and transmits a digital signal from the transmission end to reception end thereof.

The driver 4A includes NMOS transistors Tn11, Tn12 and Tn13, and resistors R11 and R12. The NMOS transistors Tn11 and Tn12 forming a differential pair are connected at the drains thereof to the source of the power $V_{dd}$ via the resistors R11 and R12, respectively. Also, the current control NMOS transistor Tn13 is connected at the drain thereof to the sources of the NMOS transistors Tn11 and Tn12, respectively, and the NMOS transistor Tn13 is connected at the source thereof to the substrate ground (reference ground) of the LSI chip.

The NMOS transistors Tn11 and Tn12 are supplied at the gates thereof with a digital signal that drives the signal transmission line 30. The output of the driver 4A, that is, the drains of the NMOS transistors Tn11 and Tn12, is connected by the directional coupler 8 to the transmission end of the signal transmission line 30.

The power/ground pair transmission line 40 is disposed to extend from the driver 4A to a source of a power $V_{dd}$ or a nearby bypass capacitor and thus supplies the power $V_{dd}$ to the driver 4A. The power/ground pair line 40 is connected at one of the power-side wire ends thereof to the drains of the NMOS transistors Tn11 and Tn12 of the driver 4A via the resistors R11 and R12, and at the other wire end to the power-side terminal of the power source of the power $V_{dd}$ or bypass capacitor. Also, the power/ground pair line 40 is connected at both the ground-side wire ends thereof to the substrate ground (reference ground) of the LSI chip in places where the driver 4A and main power circuit or bypass capacitor are located, respectively.

The receiver 5A includes NMOS transistors Tn21, Tn22 and Tn23, and resistors R21 and R22. The NMOS transistors Tn21 and Tn22 forming a differential pair with each other are connected at the drains thereof to the power $V_{dd}$ via the resistors R21 and R22. The NMOS transistor S23 is provided to control the current, and it is connected at the drain thereof to the sources of the NMOS transistors Tn21 and Tn22, respectively. Further, the NMOS transistor Tn23 is connected at the source thereof to the substrate ground (reference ground) of the LSI chip. Thus, the receiver 5A is supplied at the gates of the NMOS transistors Tn21 and Tn22 thereof with the digital signal directly from the signal transmission line 30.

The directional coupler 8 has a small, simple structure having an energy-input pair wire 81 and energy-pass pair wire 82 each having a predetermined length and which are laid in the vicinity of each other and in materials different in dielectric constant from each other. The directional coupler 8 cuts off DC component of an input digital signal while allowing wide-band AC component of the digital signal to pass by. The energy-input pair wire 81 of the directional coupler 8 is connected at the leading end thereof to the output of the driver 4A, that is, the drains of the NMOS transistors Tn11 and Tn12, and the trailing end of the energy-input pair wire 81 is a floating, open end. The energy-pass pair wire 82 of the directional coupler 8 is connected at the trailing end thereof to the transmission end of the signal transmission line 30, and the leading end of the energy-pass pair wire 82 is also a floating, open end.

The signal transmission system 100A provided with a single coupler at the transmission end thereof, shown in FIG. 7, has a simplest circuit configuration. A current to be charged flows through the transmission line 30. In the case of this transmission line 30, however, both the coupler-input and -output ends are open. Therefore, no DC current to be held will flow through the transmission line 30. An electric energy arriving at the coupler-output end cannot go anywhere, and thus the energy will be charged there as in a memory. This circuit is ideal for a short directional coupler 8. If the directional coupler 8 is long, the energy will be reflected in the coupler 8 at a side where it has arrived at and go back to the transmission 30. On this account, the directional coupler 8 should be limited in length to less than 1/40 of the wavelength. Therefore, the directional coupler 8 should desirably be formed in a semiconductor chip to implement the signal transmission system 100A with a single coupler provided at the transmission end thereof, as will be described in detail later.

Figure 8:
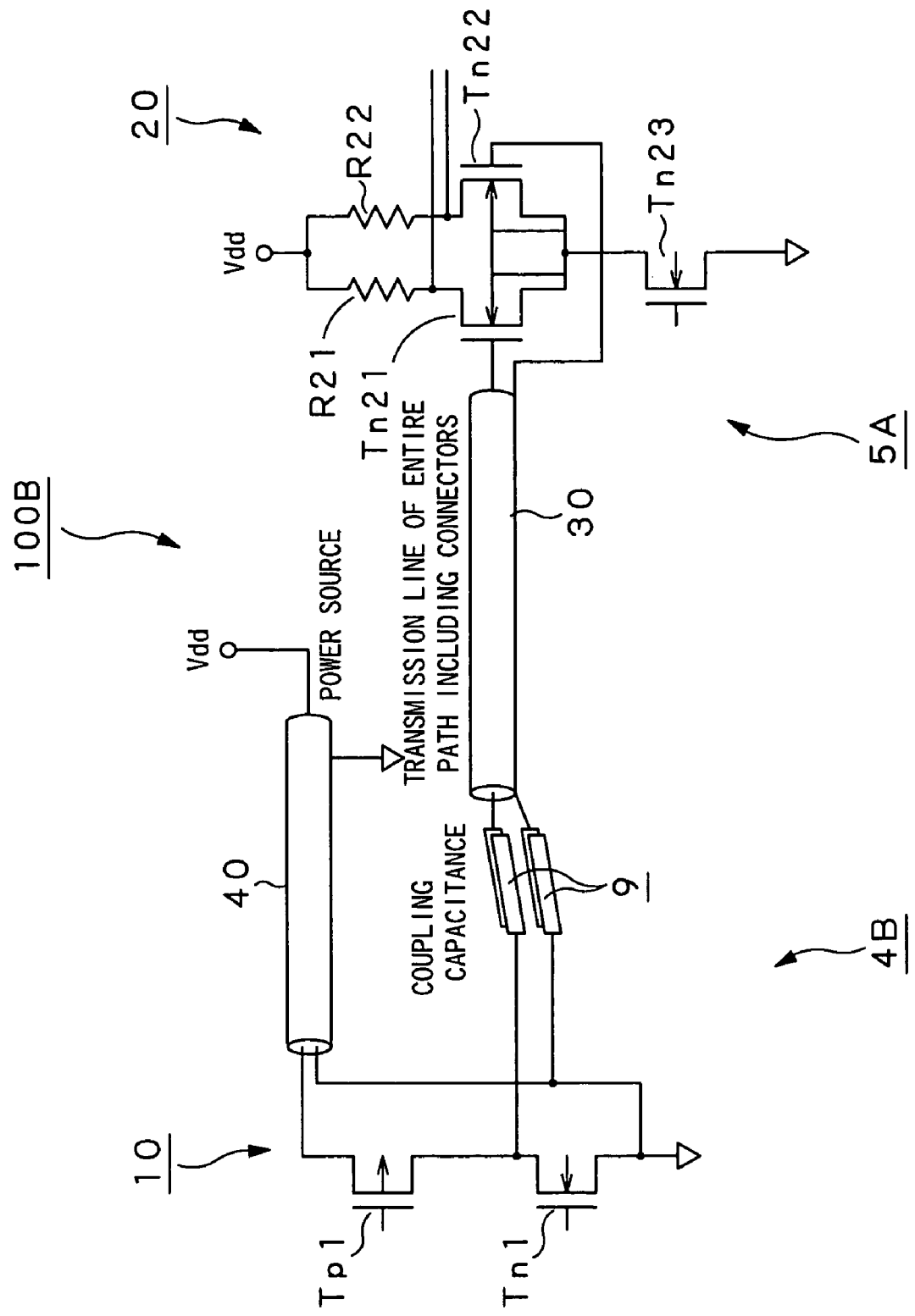
FIG. 8 shows, in the form of a circuit diagram, a constructional example of a signal transmission system with a capacitive coupling at the transmission-end.

FIG. 8 shows a constructional example of a signal transmission system 100B with a capacitive coupling at the reception end. In the signal transmission system 100B, a coupling capacitor 9 (91 and 92) is additionally connected in series instead of the aforementioned directional coupling 8, as shown in FIG. 8. In case the coupling capacitor 9 (91 and 92) is long, it should desirably be formed in a chip. Since the coupling capacitor shown in FIG. 8 is too long, the coupling capacitor 9 (91 and 92) should be a short chip capacitor to implement the capacitive coupling in a substrate.

In the signal transmission system 100B, the coupling capacitor 9 (91, 92) is inserted between the driver 4B in the circuit block 10 and signal transmission line 30, and the receiver 5A of the other circuit block 20 is connected directly to the signal transmission line 30.

The aforementioned driver 4B is a CMOS inverter including, as components, a PMOS transistor Tp1 provided at the power side and an NMOS transistor Tn1 provided at the ground side. The PMOS transistor Tp1 and NMOS transistor Tn1 are supplied at the gates thereof with a digital signal which drives the signal transmission line 30. The output of the driver 4B, that is, the drains of the PMOS transistor Tp1 and NMOS transistor Tn1, is connected to the transmission end of the signal transmission line 30 via the coupling capacitor 9 (91 and 92). Also, the NMOS transistor Tn1 is connected at the source thereof to the substrate ground (reference ground) of the LSI chip.

The power/ground pair line 40 is disposed to extend from the driver 4B to the source of the power $V_{dd}$ or a nearby bypass capacitor, and it supplies the power $V_{dd}$ to the driver 4B. The power/ground pair line 40 is connected at the power-side wire ends thereof to the source of the PMOS transistor Tp1 at the power side of the driver 4B and power-side terminal of the source of the power $V_{dd}$ or nearby bypass capacitor, respectively. Also, the power/ground pair line 40 is connected at both the ground-side wire ends thereof to the substrate ground (reference ground) of the LSI chip in places where the driver 4B and source of the power $V_{dd}$ or bypass capacitor are located, respectively.

Figure 9:
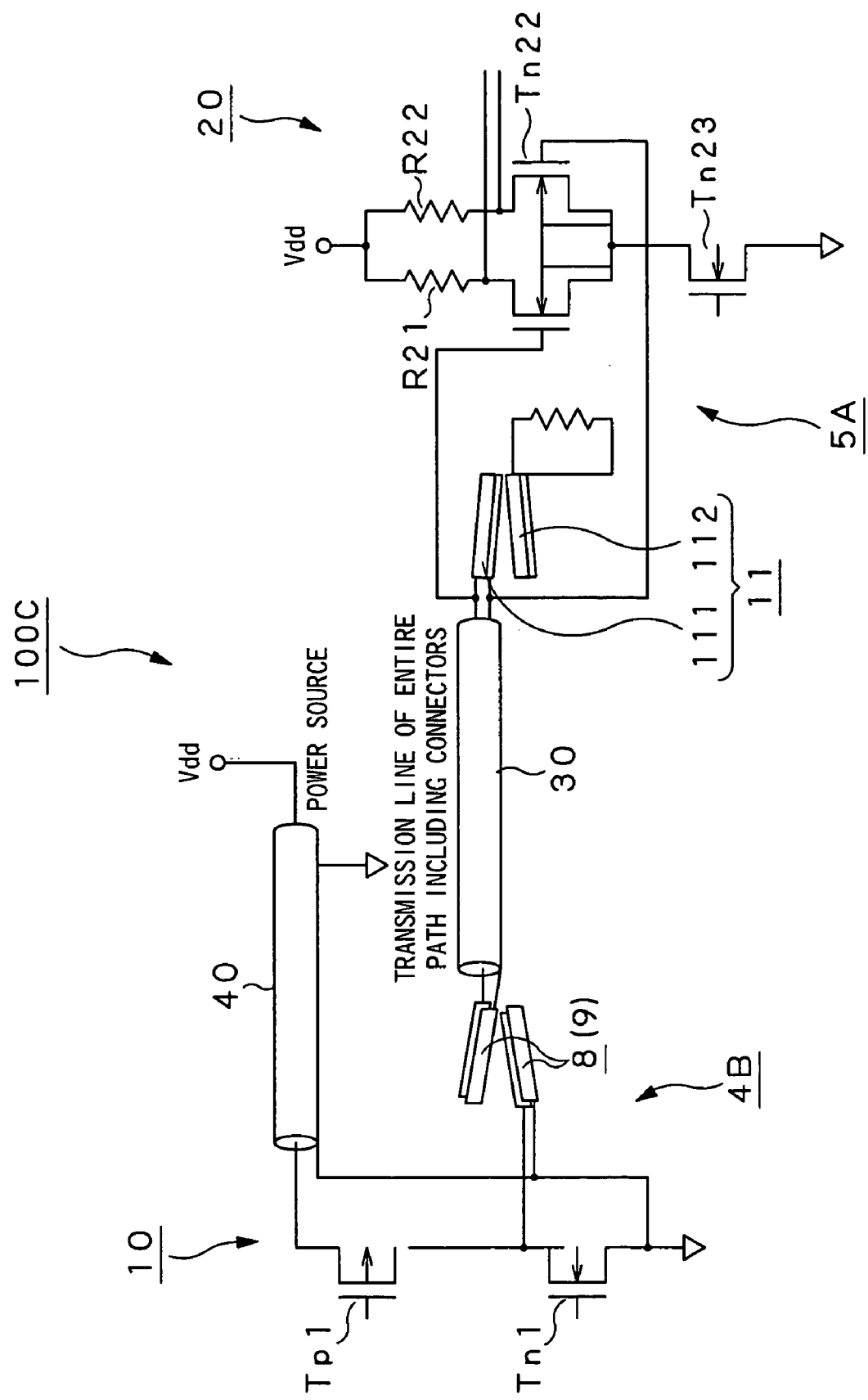
FIG. 9 shows, in the form of a circuit diagram, a constructional example of a signal transmission system with a terminating-resistance type double coupler.

FIG. 9 shows a constructional example of a signal transmission system 100C with a terminating-resistance double coupler. The signal transmission system 100C includes directional couplers 8 and 11 provided at opposite ends, respectively, of the transmission line 30. Each of the directional couplers 8 and 11 may be a coupling capacitor.

The directional coupler 11 at the reception end has a small, simple structure having an energy-input pair wire 111 and energy-pass pair wire 112 each having a predetermined length and which are laid in the vicinity of each other and in materials different in dielectric constant from each other. The directional coupler 11 cuts off DC component of an input digital signal while allowing wide-band AC component of the digital signal to pass by. The energy-input pair wire 111 of the directional coupler 11 is connected at the leading end thereof to the reception end of the signal transmission line 30, and the trailing end of the energy-input pair wire 111 is a floating, open end. The energy-pass pair wire 112 of the directional coupler 11 is floating and open at the leading end thereof, and has a terminating resistor 12 connected to the trailing end.

The directional coupler 8 or coupling capacitor transfers only a transition electromagnetic energy from the driver 4B in one direction through the transmission line 30 and thus will not fill the transmission line 30 with electric charge. Detecting a momentary transition energy, the receiver 5A is put into operation. However, since the transition energy passes through the receiver 5A, moves to the directional coupler 11 or coupling capacitor 9 and is absorbed by the terminating resistor 12, a latch circuit has to be additionally provided downstream of the receiver 5A. This is to activate the receiver 5A only with the transition signal energy and have the receiver make a back action with a reflection signal.

The receiving-end side directional coupler 11 has the terminating resistor 12 inserted at the output end thereof, and this the charge is momentarily released so that the energy will not be reflected back. In case a coupling capacitor is used in place of the directional coupler 11, the terminating resistor 12 should be adjusted to have a resistance within a range of 50 to 1 MΩ for a resistance coupling between differential ends of the receiver (mainly for the discharging) so that the charge is released before a next clock arrives.

Figure 10:
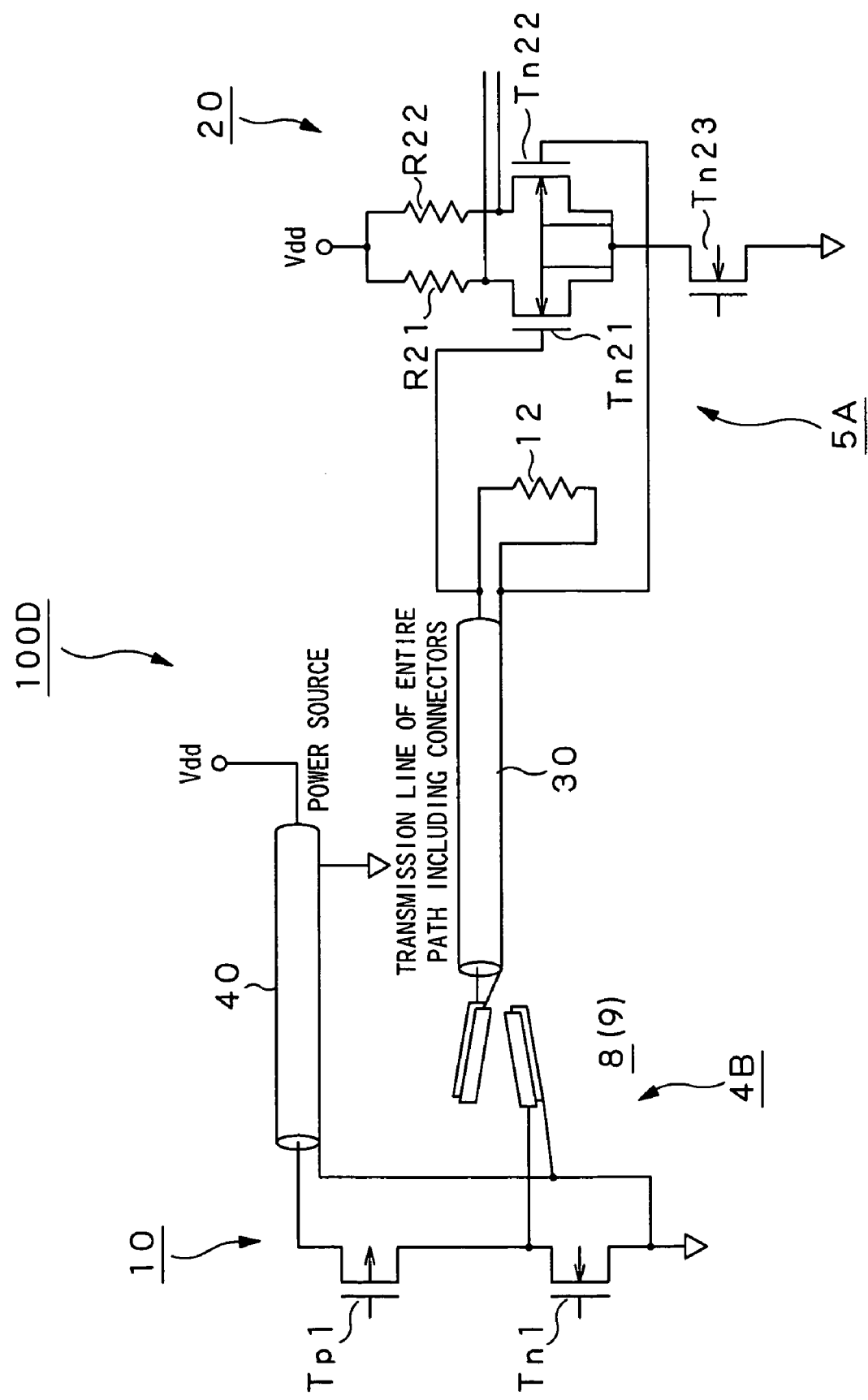
FIG. 10 shows, in the form of a circuit diagram, an example of the signal transmission system shown in FIG. 9 and which uses a quality, high-speed transmission line.

FIG. 10 shows a signal transmission system 100D as a version of the signal transmission system 100C in FIG. 9 in which the transmission line 30 is a high-speed, quality one. In the signal transmission system 100D, the directional coupler 11 at the reception end is not provided but the terminating resistor 12 is connected directly to the reception end of the transmission line 30. Only the transition energy component travels through the transmission line 30, the receiver make a response to the energy, and the latter is absorbed by the terminating resistor 12. In this case, the terminating resistor 12 is matched with the characteristic impedance of the transmission line 30.

The theory of the aforementioned operations will be described in detail later. Each of the directional couplers 8 and 11 is a smooth high-pass filter which allows a high frequency of 100 MHz to several tens GHz. The coupling capacitor replaced with each of the directional coupler 8 and 11 may be of 10 to 1000 pF in capacitance.

FIG. 11 shows a signal transmission system 100E which is an improved version of the conventional LVDS differential circuit, in which a driver 4C in the circuit block 10 is connected at the output end thereof to the transmission line 30 via the directional coupler 8 or coupling capacitor to transmit a digital signal to the circuit block 20 via the transmission line 30 in such a manner that no reference is made to the ground and have the receiver 5B receive the digital signal. To transmit only transition energy, a latch circuit has to be provided downstream of the receiver 5B. Of course, the signal transmission system 100E may be of any other transmission line structures as having been described above with reference to FIGS. 7 to 10 and also the receiver 5B may be replaced.

As FIGS. 7 to 11 show the power/ground pair line 40, the line for supply of the power $V_{dd}$ is in pair with the ground. On the assumption that the transistor-on resistance of an inverter as the driver is 500 to 1000 Ω and the characteristic impedance $Z_{0s}$ of the signal transmission line 30 is 50 Ω, the signal will have an amplitude $v$ given as follows:

$$v = V_{dd}(50/550) \text{ to } V_{dd}(50/1050)$$

Therefore, the receiver is a sense amplifier to detect the level of the amplitude and should desirably be a differential circuit constructed as shown in FIGS. 7 to 11. Given a pulse of 10 GHz, voltage rise time $t_r$ and decay time $t_f$ are 35 ps at maximum, and they are normally shorter than 35 ps. In case the pulse changes so quickly, the transmission line coupler (directional coupler 8) can be used to transmit a digital signal including wideband harmonics with the use of the function of a DC cut-off filter. Even with a control signal including much enable or acknowledge DC component, such as CAS, RAS, CS, etc., an amount of charge will be sufficient for gate charging of the sense amplifier as the receiver after passing through the directional coupler 8 or coupling capacitor, and thus the digital signal can be received and held in a latch circuit provided following the sense amplifier. It should be noted that if the terminal resistor 12 is connected in series, a control signal having much DC component will always consume the power and hence this arrangement is not well acceptable by the chip device designers who basically stand on the lumped-element circuit in this field of technique. Since it is necessary to prevent reflection in case the harmonic is shorter in wavelength than the line lengths listed in Table 1, the terminating resistor 12 is a must but any excessive DC component should be converted into heat energy. This is the reason for insertion of the directional coupler or coupling capacitor 9.

Since it is necessary to transmit digital signals at the electromagnetic wave velocity, both the trailingend directional coupler 11 and terminating resistor 12 are made of metal. Any resistor and line made of a polycrystal semiconductor may not be used because such a semiconductor has a charge transfer speed of about $5 \times 10^4$ m/s when applied with a saturation field, that is three digits lower than the electromagnetic wave velocity. The characteristic impedance $Z_{0p}$ of the power/ground pair line 40 may not be so much reduced for a resistance load $R_L$ (in relation to the power source) as a sum of values at the driver and trailing end is within a range of 550 to 1050 Ω. Namely, for supplying an electric energy to $n$ signal drivers through one power/ground pair line, the resistance load $R_L$ should meet an inequality given as follows:

$$R_L/n > Z_{0p} \tag{5}$$

This inequality (5) is already defined in the aforementioned cited patent documents 1 and 2.

Taking the signal transmission system 100D having been described above with reference to FIG. 10, the concept of the energy charging in the signal transmission line 30 will be described below with reference to FIG. 12.

Figure 12:
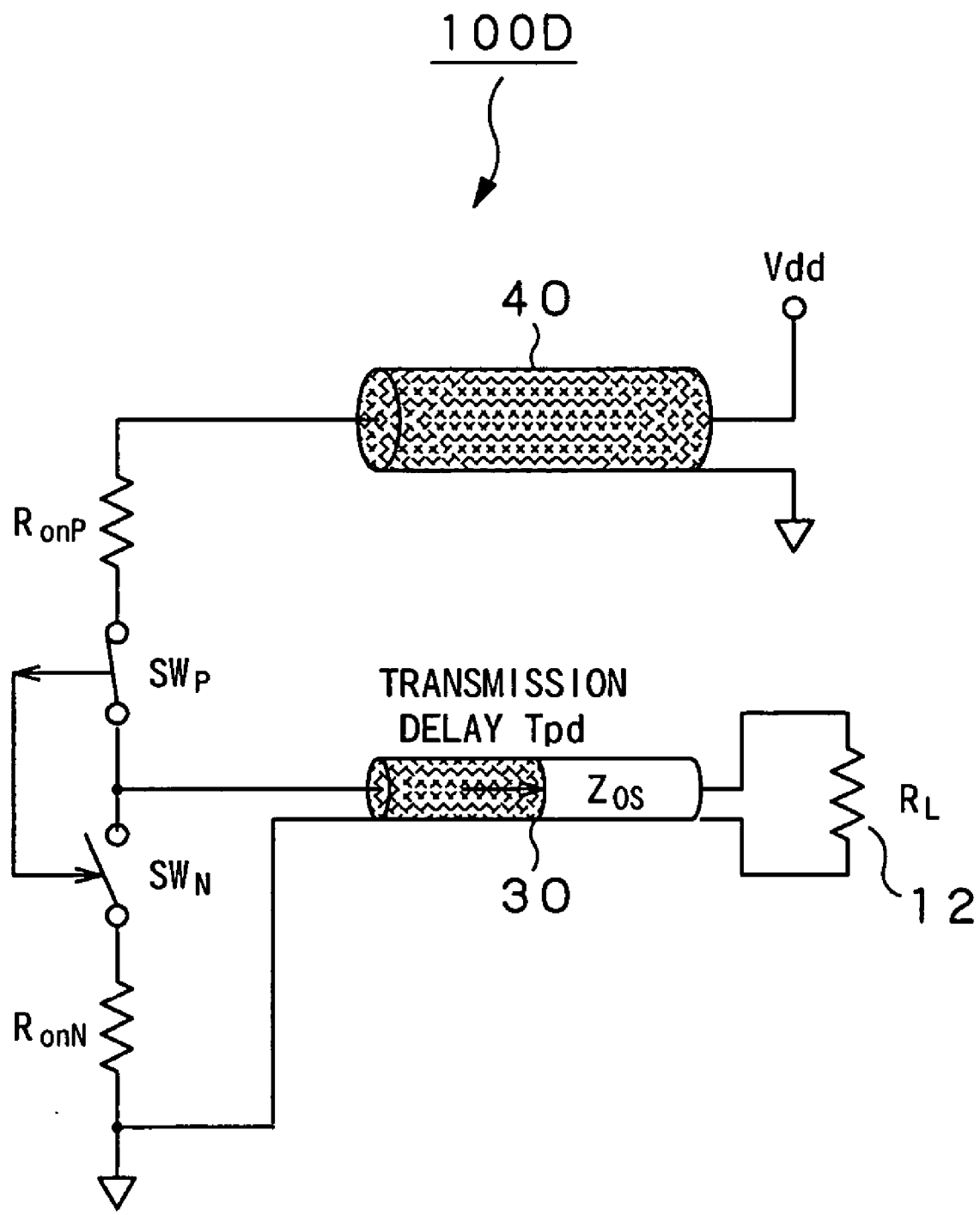
FIG. 12 explains the energy transfer mechanism of the signal transmission line.

In FIG. 12, the PMOS transistor Tp1 and NMOS transistor Tn1 included as components of the driver 4B are shown as an equivalent series circuit of complementary switches $SW_P$ and $SW_N$ and on resistors $R_{onP}$ and $R_{onN}$. At the moment the PMOS transistor Tp1 connected to the power $V_{dd}$ of the driver is turned on, a load will develop as a sum of a resistance of the resistor $R_{onP}$ of the PMOS transistor Tp1 and characteristic impedance $Z_{0s}$ of the signal transmission line 30.

$$i = V_{dd}/R_{onP} + Z_{0s} \tag{6}$$

where i is a current.

The current $i$ given by the equation (6) will flow through the transmission line for a time $t_{on}$ for which the transistor is on or for a time $t_{pd}$ of transmission delay. The current i will flow for the time $t_{on}$ or $t_{pd}$ whichever is shorter.

When the signal energy arrives at the terminating resistor 12 after lapse of the time $t_{pd}$, the load $Z_{0s}$ will disappear from the signal transmission line 30 as if a water pipe had been fully charged with water, and the resistance $R_L$ of the terminating resistor 12 will take the place. In this case, since $Z_{0s} = R_L$, the current will remain unchanged to provide an amount of charge Q eventually depending upon one on-pulse time $t_{on}$ and given as follows:

$$Q = i \times t_{on} \tag{7}$$

Here, it is assumed taking in consideration that the current according to the electromagnetic wave vector flows through the signal transmission line 30 toward the terminating resistor 12 that the transistor connected to the ground turns or, namely, the input signal shifts to High state while the power is off. Since the signal level shifts to the ground level, i=0. Water filled in a pipe has a kinematic energy toward the end of the pipe. Similarly, the charge in the signal transmission line 30 will be transferred all as it is and converted into heat energy at the terminating resistor 12. Then, the NMOS transistor Tn1 connected to the ground will turn on while no charge will move, which apparently results in no operation.

Figure 3:
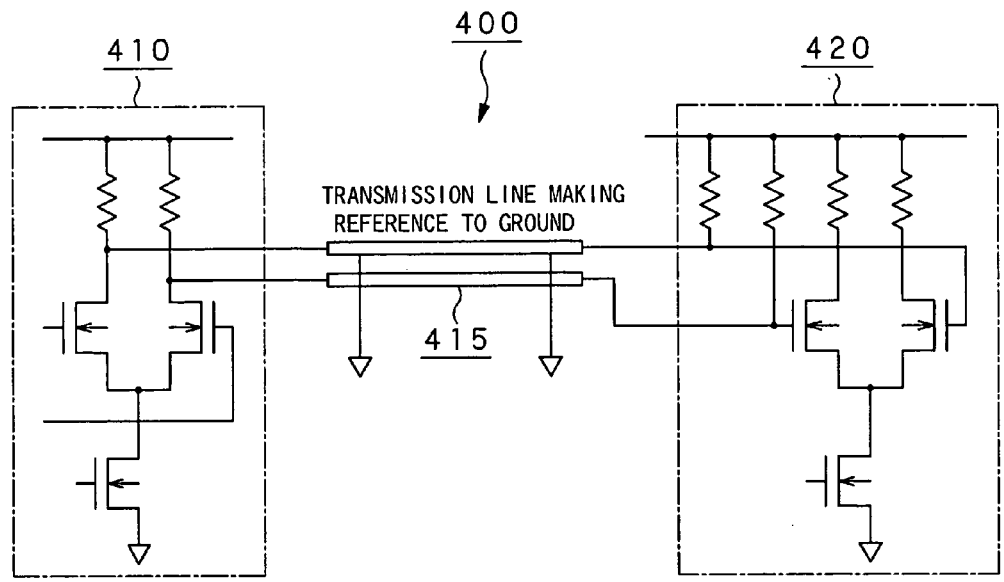
FIG. 3 shows a constructional example of a conventional CML-type differentiation circuit.
Figure 4:
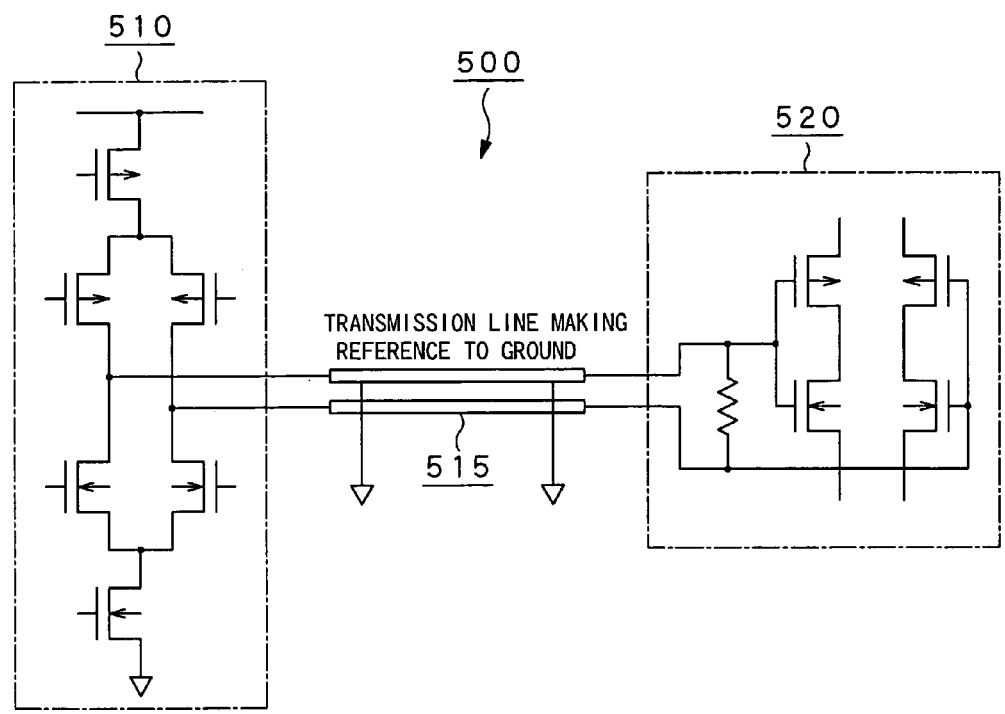
FIG. 4 shows a constructional example of a conventional LVDS-type differentiation circuit.

As above, in the circuit shown in FIG. 12, pulse-off signal needs no energy, and thus the circuit in FIG. 12 permits to save energy as compared with the conventional LVDS differential circuit 500 shown in FIG. 4. However, the circuit shown in FIG. 12 is inferior in the respect of energy to the conventional circuit 400 shown in FIG. 3 in which only a load carrying capacity $C_L$ is a required amount of charge (energy) $Q = C_L V_{dd}$.

According to this embodiment, the above problem is solved by inserting the directional coupler 8 or coupling capacitor 9.

The power/ground pair line 40 constructed as above functions as will be described below.

The conventional differential circuit 400 shown in FIG. 3 provides a current switch. If a current always flows through the different circuit and thus the transmission line can be switched between the power supply and grounding without any improvement in the switching, the differential circuit will be called an ideal one for use to transmit signals which are to be transmitted quickly. For the switching, however, a potential variation will invert all the capacitance between the drain and source of the transistor and capacitance between the drain and the substrate ground, resulting in discharging and charging, which will give birth to a very steep spike current. The bypass capacitor having an inductance will not be able to prevent such a spike current.

For a pulse of 20 GHz, a requirement for a rise time $t_r$=decay time $t_f$=17.5 ps has to be met. For example, when the source voltage $V_{dd}$=1 V and $R_{on}+R_L$=950+50 Ω, i=1 mA (at an amplitude of 0.1 V). Even if the inductance of the bypass capacitor is as small as $L_c$=100 pH, the voltage drop $V_{drop}$ of the source voltage $V_{dd}$ will be 5.7 mV as will be given below:

$$V_{drop}=L_c di/dt=100\ pH\times 1\ mA/17.5\ ps=5.7\ mV \qquad (8)$$

This means that one power line cannot feed 10 drivers because the voltage drop $V_{drop}$ of the power source is 5.7 mW. In combination with this event, a skew of the current switch and a difference between the NMOS and PMOS transistors as in the LVDS differential circuit, if any, will make the things rather worse, so that any unstable switching between the power supply and grounding will not be eliminable.

A signal transmission system in which a parallel signal is converted in a low voltage-differential serial signal for transmission is used for reducing noises and unnecessary radiation, for reducing the number of transmission lines, and as a digital interface for a liquid crystal display, stackable hub, etc.

On the contrary, the signal transmission system 100 according to this embodiment uses a transmission line having no substantial floating capacitance and inductance to provide the power/ground pair line 40 having the characteristic impedance $Z_{0p}$ as shown in FIG. 12.

A maximum permissible current $I_{max}$ supplied from the power/ground pair line 40 having the characteristic impedance $Z_{0p}$ is given as follows:

$$I_{max}=V_{dd}/Z_{0p} \qquad (9)$$

Therefore, on the assumption that the power $V_{dd}$=1 V and characteristic impedance $Z_{0p}$=25 Ω, a current Imax=40 mA can instantly be supplied without any frequency response.

Different from a phenomenon that water fully charged in a power could not instantly move at a velocity, the electromagnetic wave travels at a speed of light (1.5 to $3\times10^8$ m/s). When discharged, the transistor will be charged at a carrier speed 3 digits slower the light speed ($5\times10^4$ m/s). So, the above "instant current supply" is possible.

However, the instantaneous current supply will result in an inertia. To make the inertia to such a negligible extent, a measure should be taken which could conveniently be explained by making the analogy of a water pipe/valve system. Namely, the water system consists of a main pipe having a large inside diameter for water supply over a long distance and domestic water-intake pipes being so small in inside diameter as not to substantially disturb the water pressure through the main pipe.

On the assumption that the transistor on resistance of the inverter as the driver is $R_{on}$ and the characteristic impedance of the signal transmission line is $R_{os}$ in the signal transmission system shown in FIG. 12, the resistance load $R_D$ in relation to the power source can be given as follows:

$$R_D=R_{on}+R_{os} \qquad (10)$$

Therefore, when the source voltage $V_{dd}$=1 V and $R_{on}+R_L$=950+50 Ω, the current will be i=1 mA (at an amplitude of 0.1 V). Thus, driving of 10 drivers leads to consumption of 25% of the maximum permissible current $I_{max}$ which is a disturbance not negligible. In this case, however, there occurs no problem because the transistor's carrier speed 3 digits slower than the light speed absorbs the disturbance. This can be explained as follows. In case n signal drivers are supplied with an electric energy through a single power/ground pair line, it suffices that the characteristic impedance of the power/ground pair line meets the aforementioned inequality (5).

The directional coupler 8 constructed as above functions as will be described below with reference to FIG. 13.

Figure 13A:
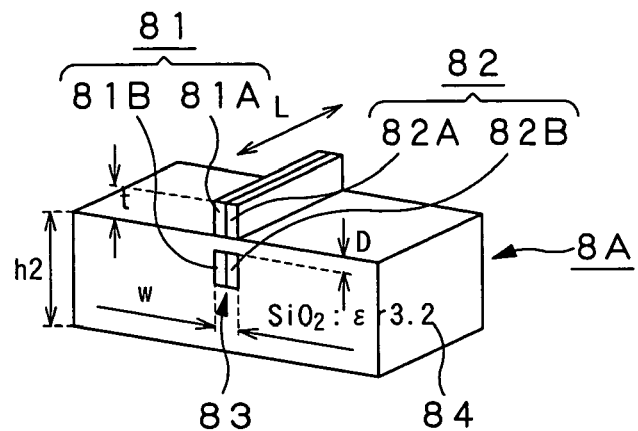
FIG. 13A is a perspective view of a directional coupler of Type 1.
Figure 13B:
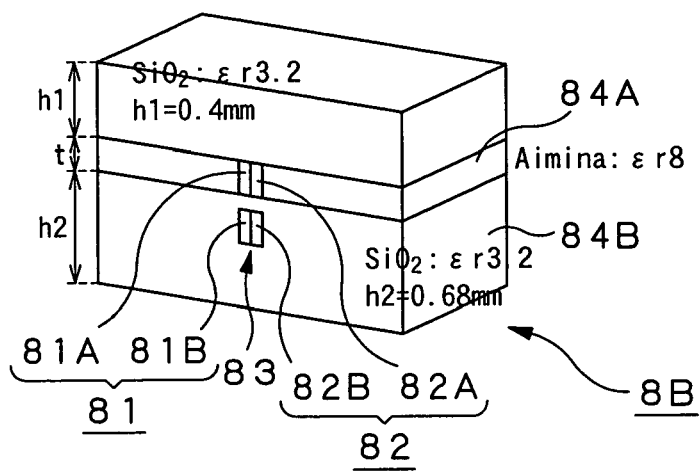
FIG. 13B is a perspective view of a directional coupler of Type 2 and FIG. 13C is a plan view of a directional coupler incorporating the features of the directional couplers Type 1 and Type 2.
Figure 13C:
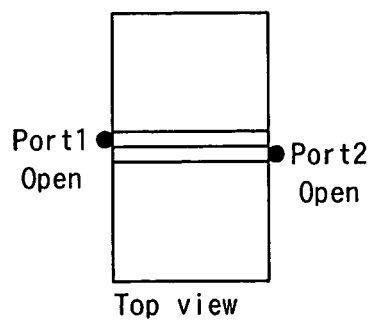

FIG. 13A is a perspective view of a directional coupler 8A of Type 1, FIG. 13B is a perspective view of a directional coupler 8B of Type 2, and FIG. 13C is a perspective view of a Type-3 directional coupler 8C of a combination of Types 1 and 2.

As shown in FIG. 13, a differential-signal transmission line deep in the direction of the signal energy is formed from a pair of wires laid, up and down, in a direction in which a signal energy is transmitted (will be referred to as "stacked-pair line" hereunder). An energy-input pair line 81 formed from stacked-pair wires 81A and 81B and an energy-pass pair line 82 formed from stacked-pair wires 82A and 82B are laid with an extremely narrow gap 83 between them so that an energy can easily be transferred from the energy-input pair line 81 to the energy-pass pair line 82.

Another feature is that since insulators 84A and 84B around the upper wires 81A and 82A forming together the energy-input pair line 81 and the lower wires 81B and 82B forming together the energy-pass pair line 82 are different from each other, the upper wires 81A and 82A in the directional coupler 8A of Type 1 in FIG. 13A are surrounded by an airspace and the lower wires 81B and 82B are surrounded by a silicon oxide $SiO_2$. Also, in the directional coupler 8B of Type 2 shown in FIG. 13B, the upper wires 81A and 82A are surrounded by alumina while the lower wires 81B and 82B are surrounded by a silicon oxide $SiO_2$.

As seen from the plan view in FIG. 13C, a port "Port 1" is provided as an input end extended from the driver, namely, an input end of the energy-input pair line 81, another port "Port 2" is provided as a receiver end at which an energy having been transmitted to next to the Port 2 is to be taken out, namely, an output end of the energy-pass pair line 82. Other ends are open.

The electromagnetic space can homothetically be reduced, and thus three dimensional examples are shown in Table 2.

TABLE 2

| Homothetic reduction | 1 | 1/100 | 1/1000 |
|---|---|---|---|
| L | 1 mm | 10 μm | 1 μm |
| W | 0.08 mm | 0.8 μm | 80 nm |
| GAP | 0.01 mm | 0.1 μm | 10 nm |
| t | 0.2 mm | 2 μm | 0.1 μm |
| D | 0.08 mm | 0.8 μm | 80 nm |

In Table 2, "L" indicates a length in the signal-transmission direction of each of the stacked-pair wires 81A and 81B and stacked-pair wires 82A and 82B in the directional couplers 8A and 8B shown in FIG. 13, "W" indicates a width of each of the stacked-pair wires 81A and 81B and stacked-pair wires 82A and 82B, and "GAP" indicates a distance between the wires. Also, "t" indicates a thickness of each of the upper wires 81A and 82A, and "D" indicates a thickness of the insulator between the upper wires 81A and 82A and lower wires 81B and 82B. Also in FIG. 13, "h1" indicates a height (e.g., h1=0.4 mm) of the insulator above the upper wires 81A and 82A, and "h2" indicates a height (e.g., h2=0.68 mm) of the insulator under the lower wires 81B and 82B.

Further, the physical phenomenon of the directional couplers 8 and 11 will be described below.

The line of electric force or magnetic force spatially spreading perpendicularly to the traveling direction is called "TEM (transverse electromagnetic) wave", and it is a waveguide mode in the transmission line. In a portion of the electromagnetic wave exposed to air, the wave travels at an electromagnetic wave velocity co as given below. In the insulating material or insulator, however, the wave travels with a specific permeability $\mu r$ and specific dielectric constant $\in r$.

$$co = 1/\sqrt{\mu o \in o} = 3 \times 10^8 \text{ m/s} \qquad (11)$$

where $\mu o$ is a specific permeability in vacuum and $\in o$ is a specific dielectric constant in vacuum.

On the assumption that the electromagnetic wave velocity is v, the velocity will be $v = co/\sqrt{\mu r \in r}$. Also, on the assumption that $\in r=4$ and $\mu r=1$, $v=1.5 \times 10^8$ m/s. In air, a wave has been a TEM wave at the start of transmission travels at an electromagnetic wave velocity double that in the insulator and so the TEM mode will be lost. The coupling becomes weak correspondingly to a TEM wave whose electromagnetic state having been within a range in which a strong coupling in the stacked-pair line causes a crosstalk between wires to be negligible, and hence the effective electromagnetic space spreads more so that the electromagnetic energy can be transferred to an adjacent stacked-pair line.

Results of simulation of a parameter S of the directional couplers 8A and 8B of Types 1 and 2 by a three-dimensional electromagnetic analysis software are shown in FIGS. 14 and 15.

Figure 14A:
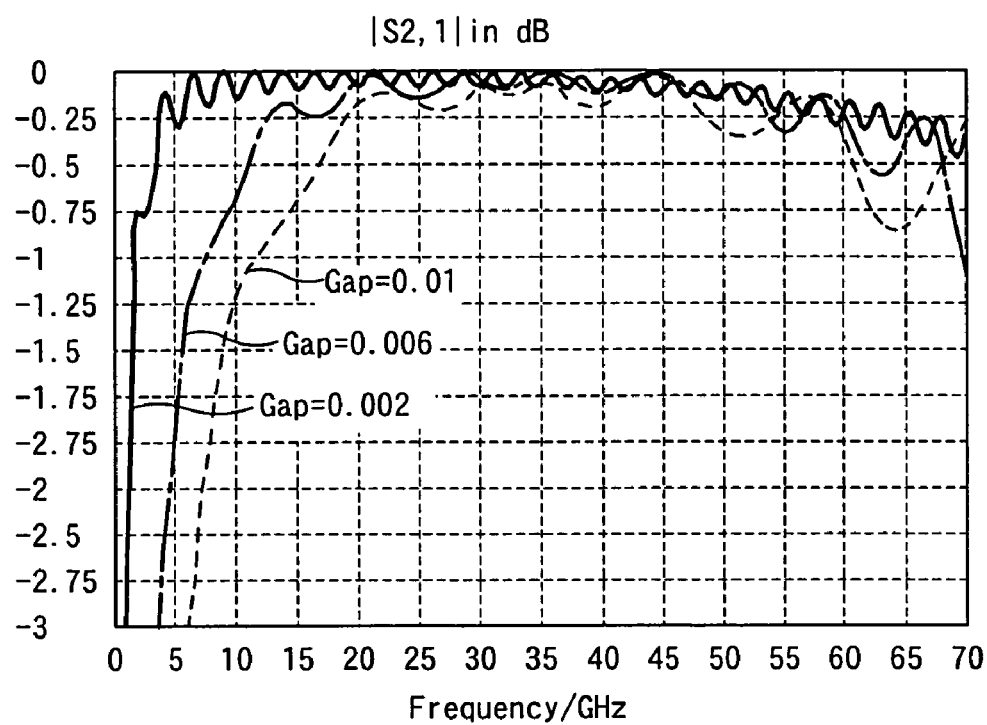
FIG. 14A shows the result of simulation of the frequency response of a parameter S21 indicative of a transmission coefficient and FIG. 14B shows the result of simulation of the frequency response of a parameter S11 indicative of a reflection coefficient.
Figure 14B:
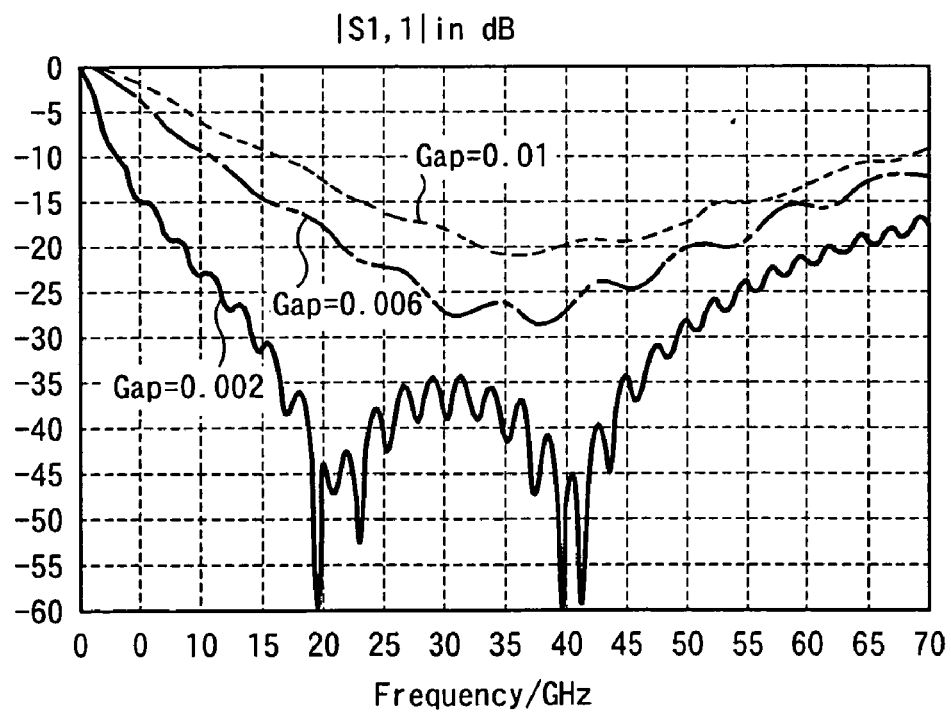

FIG. 14A shows results of simulation of the frequency response of a parameter S21 representing the permeability coefficient of the directional coupler 8A of Type 1. As shown, when the gap (GAP) is changed to 0.002, 0.006 and then to 0.01, the frequency response of an energy transferred from Port 1 to Port 2 is a sine wave of 0 to 70 GHz. FIG. 14B shows results of simulation of the frequency response to a parameter S11 representing the reflection coefficient of the directional coupler 8A of Type 1. Namely, the curve in FIG. 14B shows values of the energy reflected back to Port 1. As seen from the results of simulation, the energy should be transferred as smoothly as possible in relation to the frequency and with less reflection, and the energy can be transmitted best which can be attained when the gap (GAP) is 0.002.

Figure 15A:
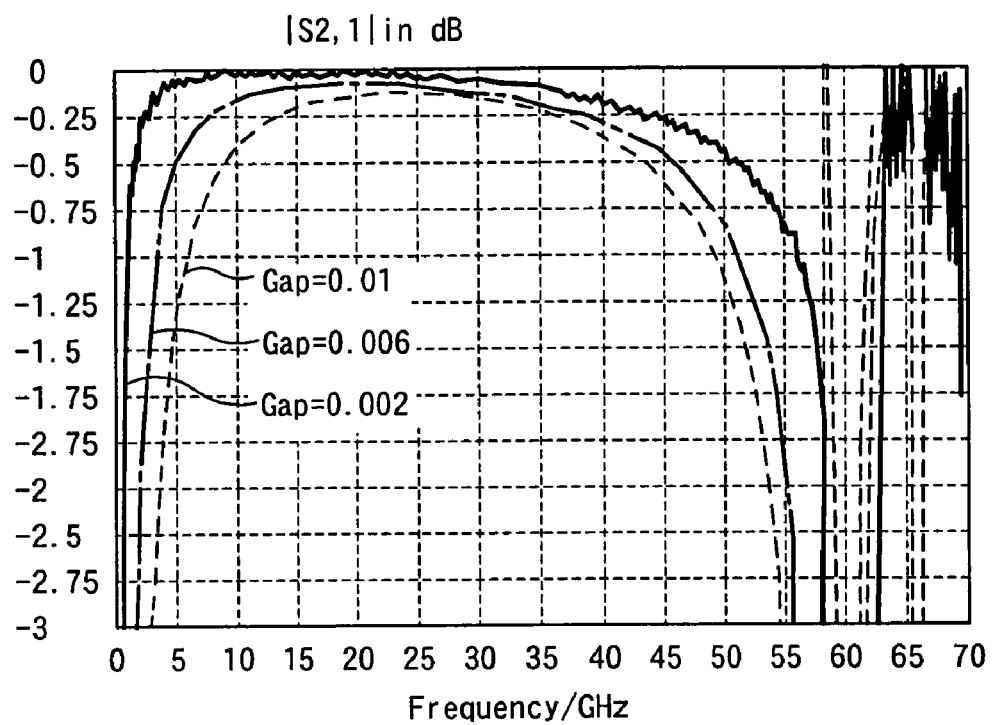
FIG. 15A shows the result of simulation of the frequency response of a parameter S21 indicative of a transmission coefficient and FIG. 15B shows the result of simulation of the frequency response of a parameter S11 indicative of a reflection coefficient.
Figure 15B:
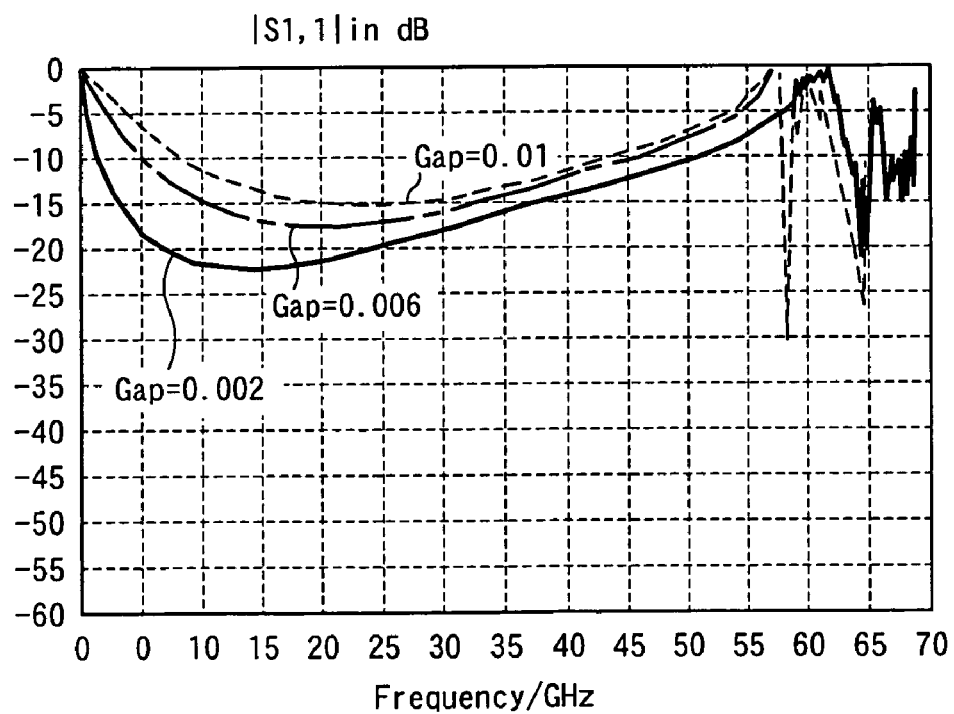

FIG. 15A shows results of simulation of the frequency response of a parameter S21 representing the permeability coefficient of the directional coupler 8B of Type 2. As shown, when the gap (GAP) is changed to 0.002, 0.006 and then to 0.01, the frequency response of an energy transferred from Port 1 to Port 2 is a sine wave of 0 to 70 GHz. FIG. 15B shows results of simulation of the frequency response to a parameter S11 representing the reflection coefficient of the directional coupler 8B of Type 2. Namely, the curve in FIG. 14B shows values of the energy reflected back to Port 1. As seen from the results of simulation, the energy should be transferred as smoothly as possible in relation to the frequency and with less reflection, and the energy can be transmitted best which can be attained when the gap (GAP) is 0.002.

Note that in FIGS. 14A and 14B and 15A and 15B, the frequency response at the gap (GAP) of 0.006 is delineated with a dashed line, frequency response at the gap (GAP) of 0.002 is delineated with a solid line, and the frequency response at the gap (GAP) of 0.01 is delineated with a broken line.

Thus, the directional coupler 8B of Type 2 can be regarded to be superior to the directional coupler 8B of Type 1 in that it can allow a lower frequency to pass by and is free from hunting. Since it is difficult to image the actual transmission of a signal wave on the basis of the parameter S, an experiment was made to measure the signal wave transmission with elements of 2 pF and 1 MΩ, respectively, equivalent to the load to the receiver transistor being connected in parallel to Port 2 of the directional coupler 8B of Type 2. Results of measurements made with supply of a pulse wave are shown in FIG. 16.

Figure 16A:
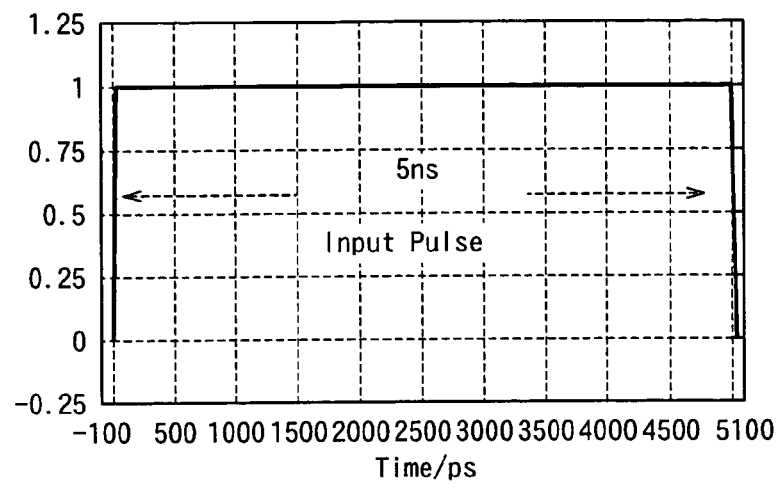
FIG. 16A shows the waveform of an input pulse.
Figure 16B:
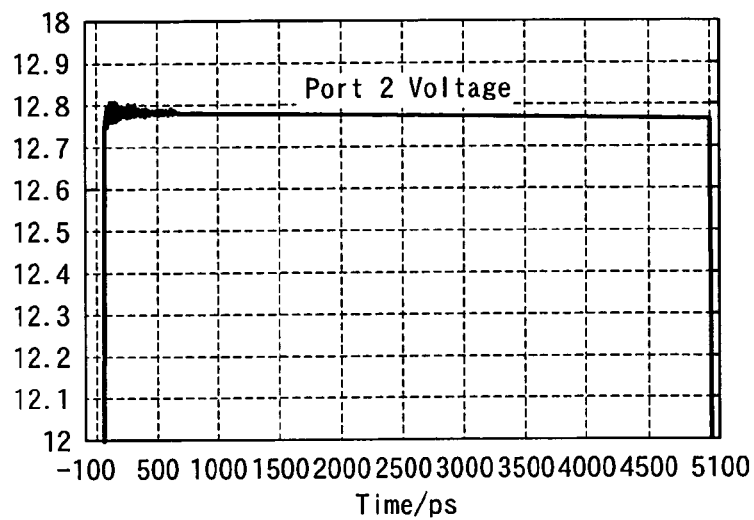
FIG. 16B shows the waveform of an output voltage from a port 2, corresponding to the input pulse
Figure 16C:
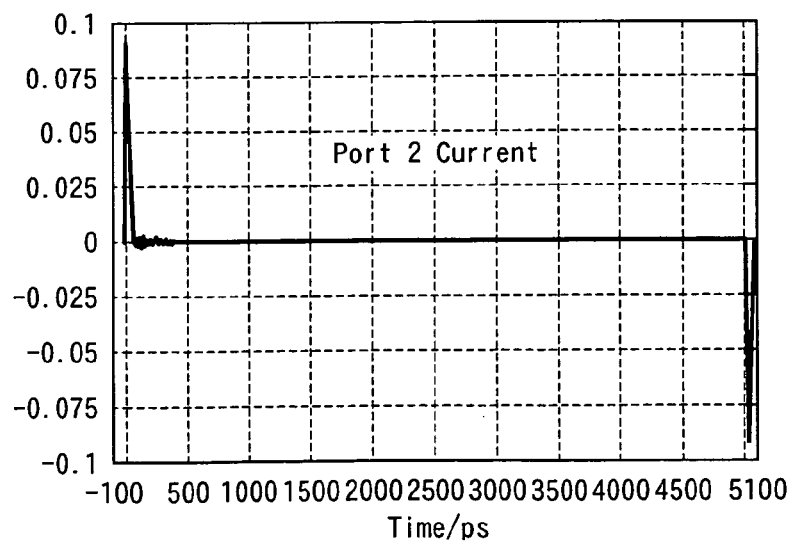
FIG. 16C shows the waveform of an output current from a port 2, corresponding to the input pulse.

FIG. 16A shows a waveform of the input pulse, FIG. 16B shows an output voltage waveform at Port 2 when the input pulse is supplied, and FIG. 16C shows an output voltage waveform at Port 2 when the input pulse is supplied.

As seen from FIG. 16, the directional coupler 8B of Type 2 can provide a well-defined output waveform when the input pulse is supplied. The rise time and decay time of the input pulse is 25 ps, and the effective pulse frequency has a waveform of 14 GHz or equivalent while the output waveform has a rise time of less than 50 ps. Thus it can be known that the directional coupler 8B can allow a frequency of 7 GHz to pass by. As shown, the output waveform appears slightly declined for the hold time because no DC energy is supplied. The slight declination corresponds to a current leak of 1 MΩ.

The trailing end of the signal transmission line is the open end of the directional coupler so that no DC current will be consumed while all the energy of AC component will dissipate to adjacent lines via the directional coupler where the energy will be stored, and all the transferred energy will be consumed across a leakage resistor. Thus, appropriate conditioning of the directional coupler will result in no complicate reflection of the energy and permit to terminate the energy transmission. Also, the power consumption due to the DC current can advantageously be suppressed. Further, a control signal whose amplitude turns on and off in a long period can be transmitted at the same level of the source voltage $V_{dd}$.

Figure 17:
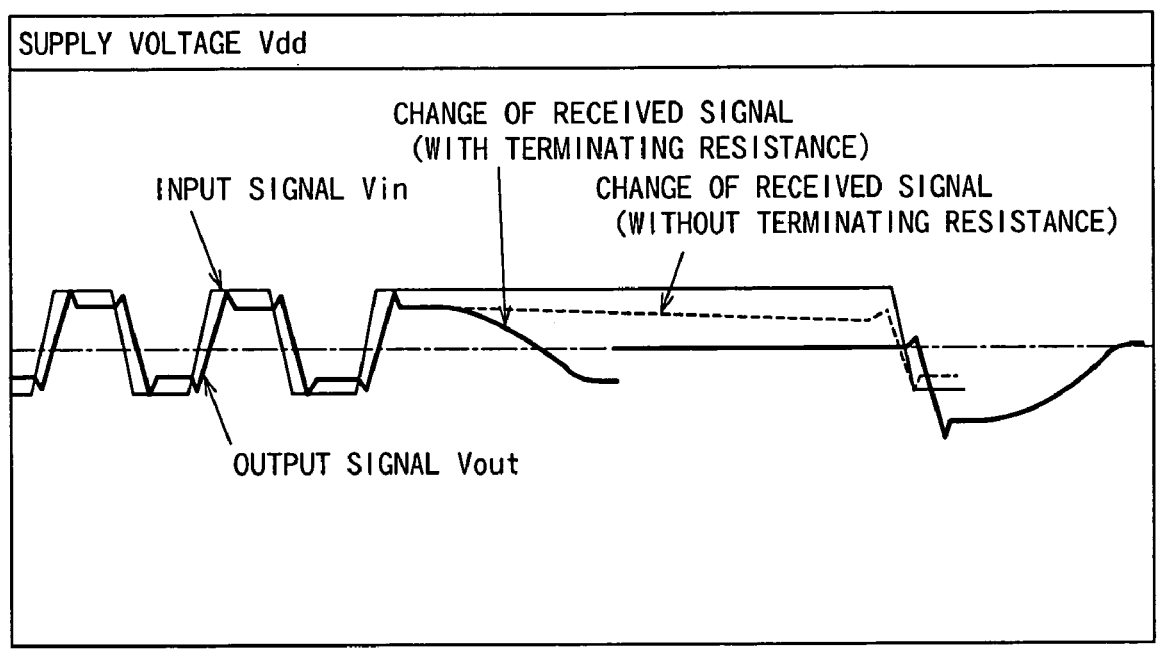
FIG. 17 shows a model of a transmission signal waveform, prepared on the assumption that the signal transmission line is loaded in an embodiment of the present invention.

FIG. 17 shows a transmission signal waveform model prepared on the assumption that the signal transmission line is loaded.

In FIG. 17, an input signal $V_{in}$ is indicated with a thin solid line, and a variation of a reception signal as an output signal $V_{out}$ corresponding to the input signal $V_{in}$, provided in the signal transmission systems 100C and 100D in FIGS. 9 and 10, respectively, in which the terminating resistor 12 is provided, is indicated with a thick solid line. Also, a variation of the reception signal provided in the signal transmission systems 100A, 100B and 100E shown in FIGS. 7, 8 and 11, respectively, in which the terminating resistor 12 is not provided, is indicated with a broken line.

When the source voltage $V_{dd}$ is applied, the signal amplitude takes a small value depending upon the transistor-on resistor. A signal such as a clock signal will keep a waveform thereof as it is, but a signal having a waveform whose hold time is long will not be passed through the directional coupler and a harmonic having passed through the directional coupler will have the energy thereof dissipated across a resistor. Because of these two respects, a reception signal waveform will be zero in an attenuation curve following an RC integral attenuation curve of the directional coupler. Since the reception signal waveform decays gradually, so it will not undershoot so that the differential amplifier of the receiver will not be inverted. When the signal turns off, it will deflect in the negative direction. In this case, the differential sense amplifier of the receiver will be inverted because it needs no reference potential. A latch circuit, if any, provided downstream of the differential sense amplifier can detect a correct signal independently of the hold time of the signal.

If the transmission line is long, a DC current will flow for the aforementioned transmission delay time $t_{pd}$. In the signal transmission systems 100C and 100D shown in FIGS. 9 and 10, the electric charge will be absorbed as it is by the terminating resistor 12. In the signal transmission systems 100A, 100B and 100E shown in FIGS. 7, 8 and 11, after the signal transmission line 30 is charged, the amount of charge will decrease correspondingly to a DC conductance of a load. In case the directional coupler 11 is provided just before the receiver, charges stay in the transmission line 30 and not released until the driver can be inverted, and thus the provision of the directional coupler 8 at the driver end is advantageous against energy consumption.

Figure 1:
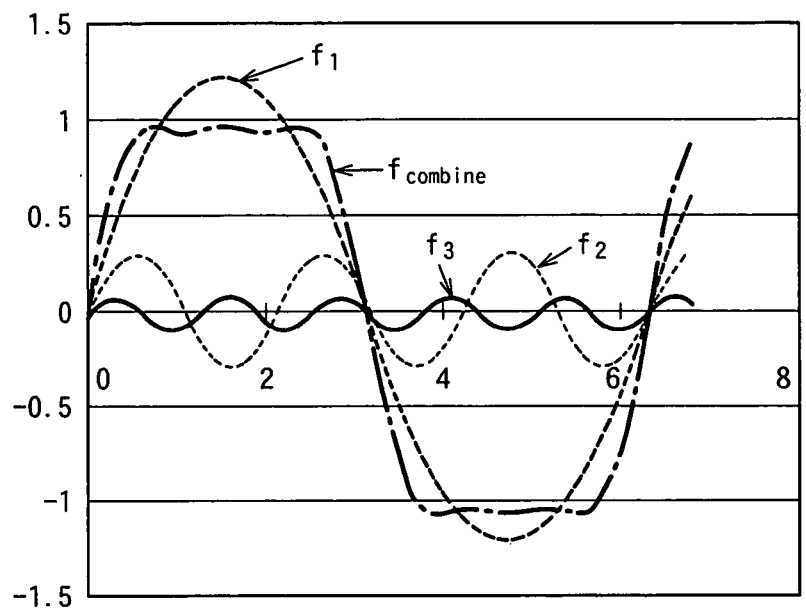
FIG. 1 explains decomposition of a pulse waveform (Fourier series)
Figure 2:
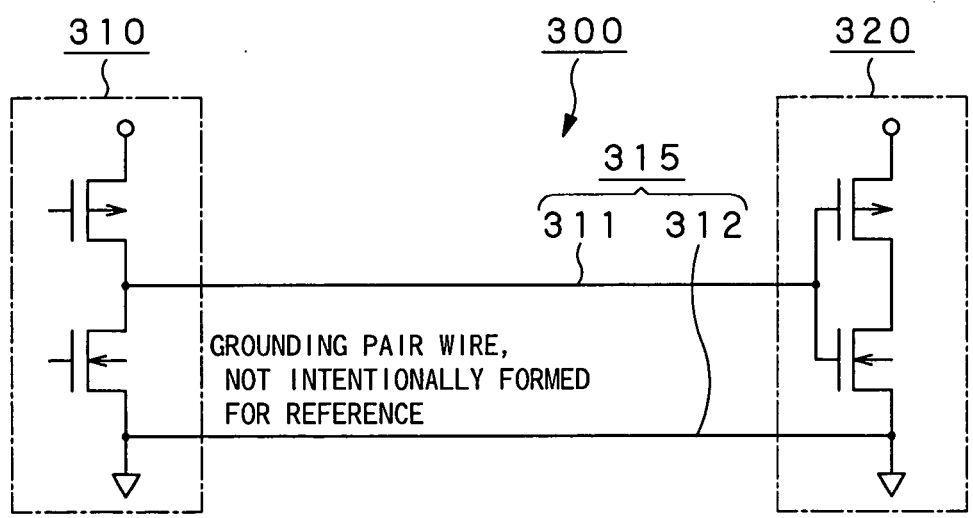
FIG. 2 shows a constructional example of a conventional single-ended digital signal transmission circuit.

In the signal transmission systems 100B to 100D shown in FIGS. 8 to 10, when the NMOS transistor Tn1 in the driver 4B turns on and connects to the ground, the charges will regurgitate and be released to the ground. Different from the discharging to the load capacity as in the conventional circuit 300 in FIG. 2, the regurgitation and release of the charges will take place like a pulse flow in the transmission delay time $t_{pd}$. If the transmission delay time $t_{pd}$ is loner than a half of the clock period, charging will start before completion of discharging, so that the signal will be disturbed as if it were caused by a multireflection. Therefore, the signal transmission system 100A in FIG. 7 is applicable under a condition as given by the following inequality (12). In case the transmission line 30 is long, it is essential that the directional coupler 8 should be provided at the driver end.

$$\frac{1}{2} \text{ of clock period} > t_{pd} \tag{12}$$

As an example of the capacitive coupler 9 in the signal transmission system 100B shown in FIG. 8, there is shown in FIG. 18 a model of the capacitive coupling line formed from a pair wire whose length is 50 mm and having a characteristic impedance of 50Ω, formed on a dielectric substrate (FR4) made of a glass-epoxy resin whose specific dielectric constant ∈r is 4.8.

Figure 18A:
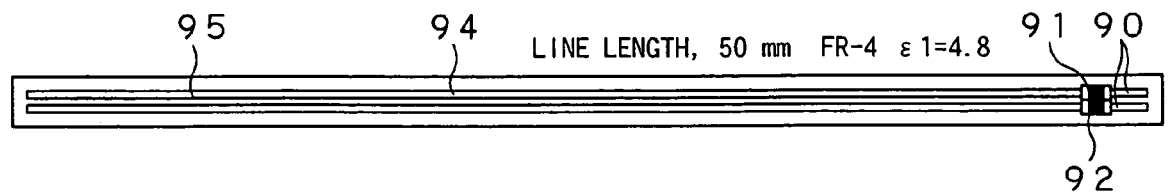
FIG. 18A shows the waveform of an input pulse.
Figure 18B:
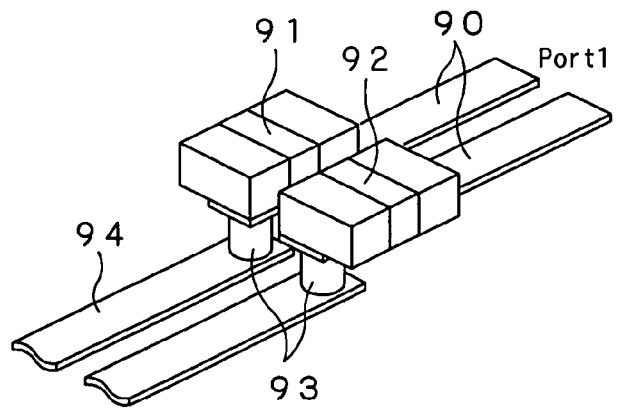
FIG. 18B is a perspective view, enlarged in scale, of the Port 1-side structure of the capacitive coupler
Figure 18C:
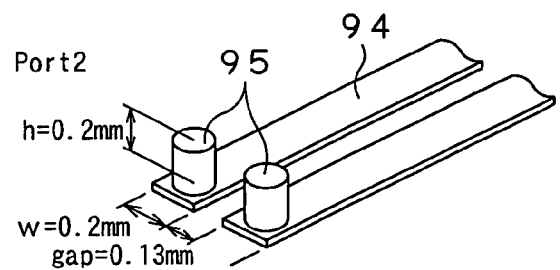
FIG. 18C is also a perspective view, enlarged in scale, of the Port 2-side structure of the capacitive coupler.

FIG. 18A is a top plan view of a model of the capacitive coupling line, FIG. 18B is a perspective view, enlarged in scale, of a Port 1-side structure of the capacitive coupling line, and FIG. 18C is a perspective vide, enlarged in scale, of a Port-2-side structure of the capacitive coupling line.

In the capacitive coupling line model, chip capacitors 91 and 92 are provided in a place of 3 mm from the end (Port 1) of a pair wire 90 having a characteristic impedance of 50 Ω. A differential signal is supplied at Port 1, and simulation was made of the signal transmitted to an end (Port 2) of inner-layer wires 94 laid on the inner walls of viaholes 93 and 95, respectively.

Figure 19A:
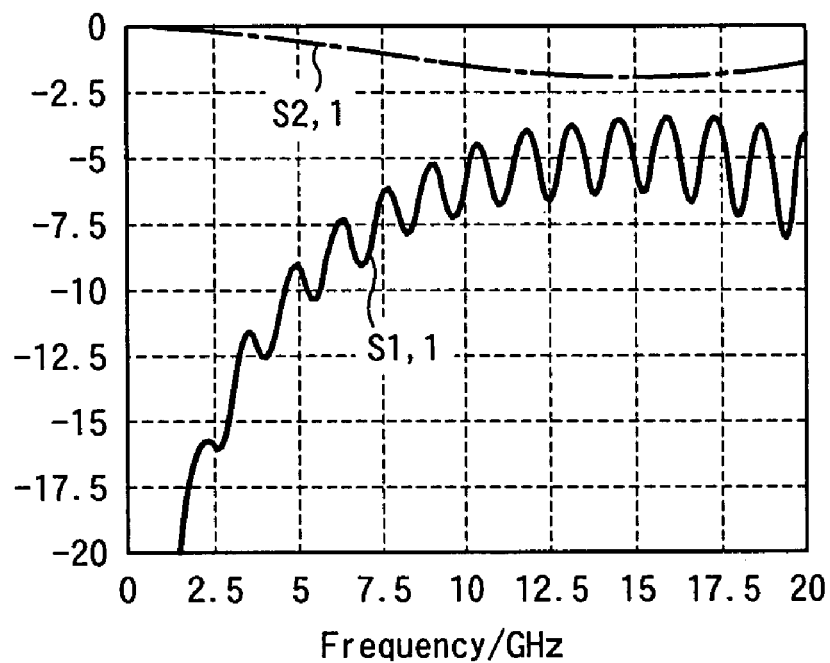
FIG. 19A shows a parameter S and FIG. 19B shows a transmission of a pulse wave.
Figure 19B:
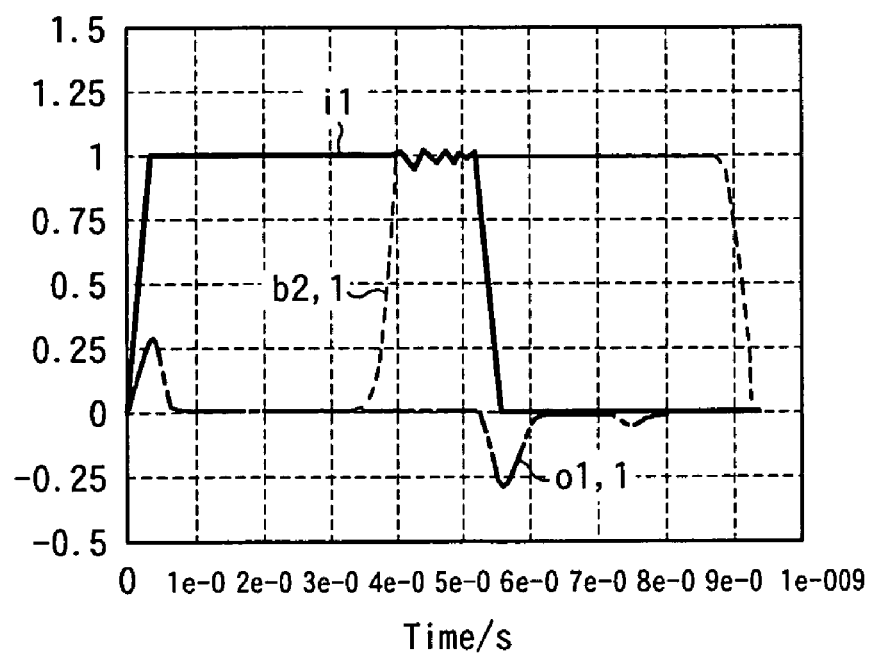

Results of simulation of the parameter S and signal waveforms, made with the chip capacitors 91 and 92 having a capacity of 0.1 μF, are shown in FIGS. 19A and 19B, respectively.

Figure 20A:
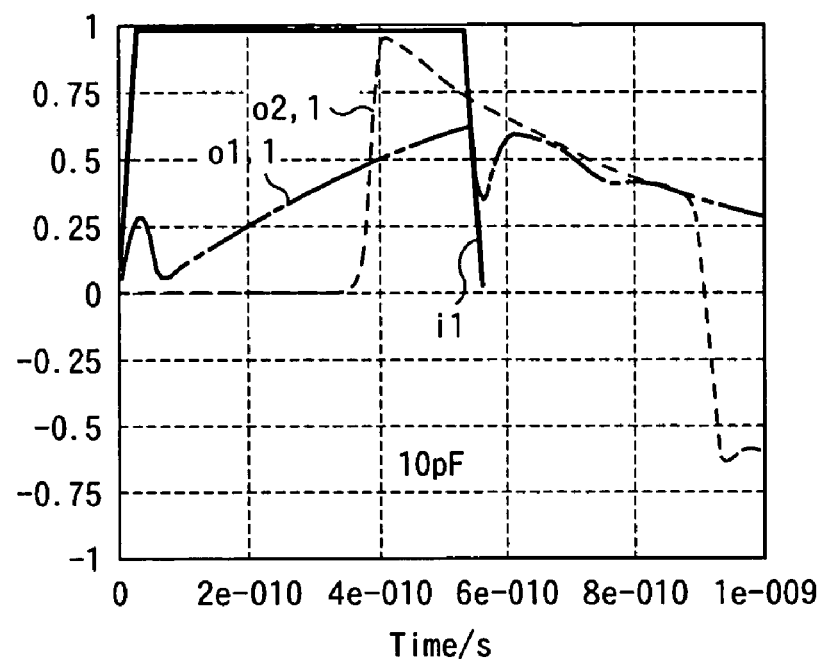
FIG. 20A shows results of signal-waveform simulation when the chip capacitor has a capacity of 10 pF and FIG. 20B shows results of signal-waveform simulation when the chip capacitor has a capacity of 100 pF.
Figure 20B:
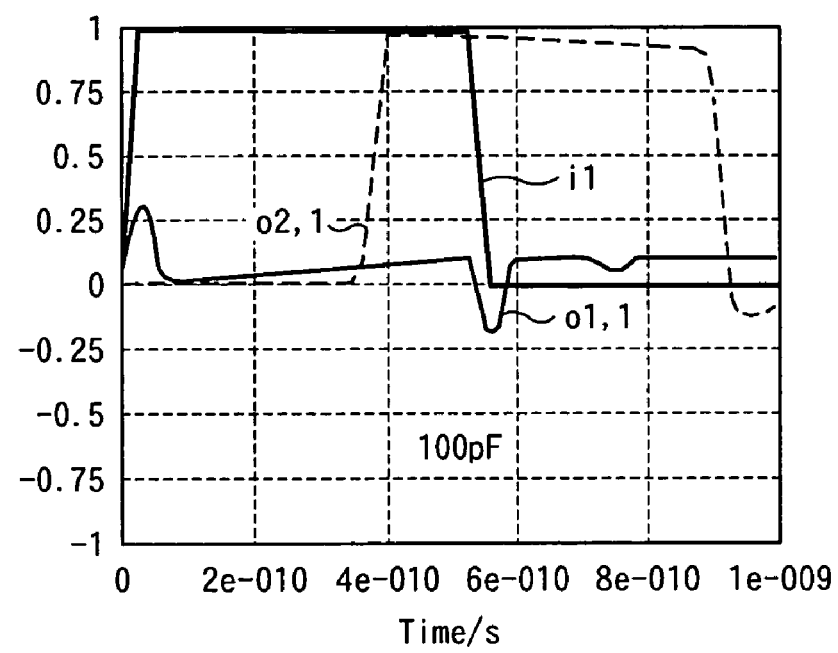

Results of simulation of a signal wave, made with the chip capacitors having a capacity of 100 pF and a capacity of 10 pF, respectively, are shown in FIGS. 20A and 20B, respectively.

The rise time and decay time of the input signal wave is 25 ps, and the effective frequency is 14 GHz. The parasitic inductance of the capacitors is 0. FIG. 19A shows a line of tan δ=0 in dielectric loss angle, of which the parameter S is not so good in comparison with the passing characteristics shown in FIGS. 14 and 15 under the influence of the viaholes. However, the pulse waveform rises and decays in a time of 50 ps, showing a sufficient transfer characteristic at a capacity of more than 100 pF. The capacity of 10 pF is too small to allow a sufficient energy. So, it is necessary to use a chip capacitor of a capacity somewhat increased.

Figure 21A:
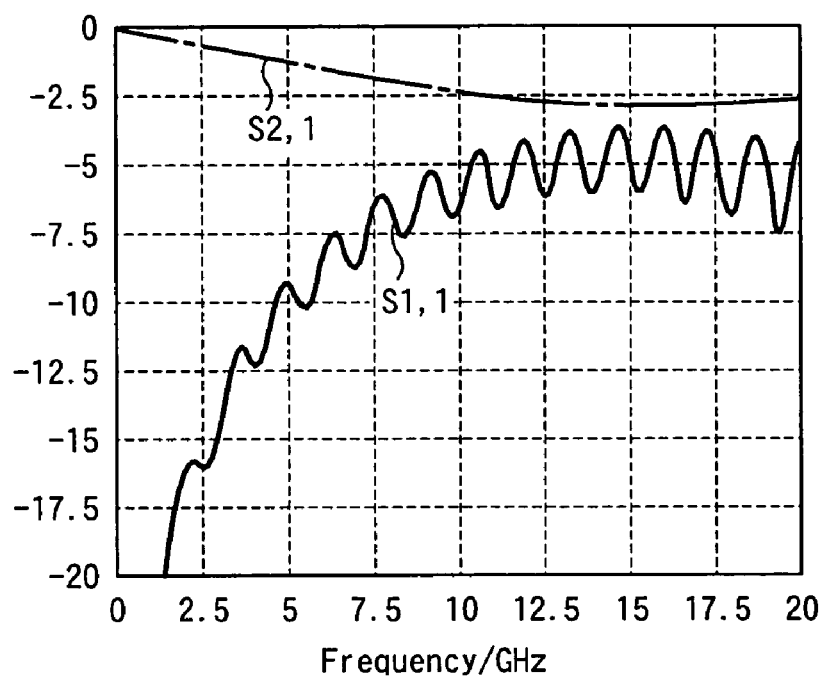
FIG. 21A shows a parameter S and FIG. 21B shows the transmission of a pulse wave.
Figure 21B:
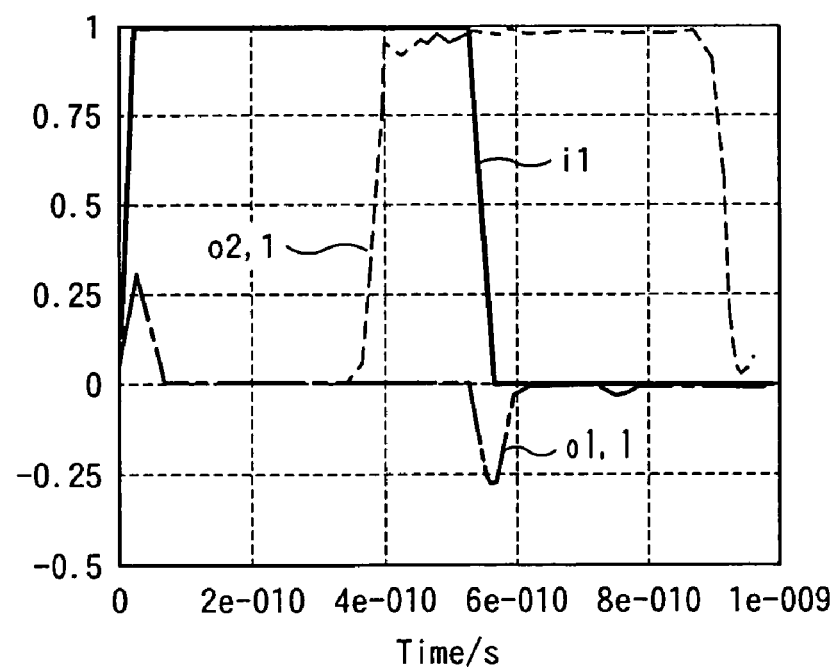

FIGS. 21A and 21B show the parameter S and pulse wave transmission when the transmission line of tan δ=0.015 in dielectric loss angle. The pulse waves shows nearly equal passing characteristics for the following reason. Namely, as given by the following equation (13), the higher the frequency $f$, the more the energy will be lost. Only the dielectric loss angle tan δ affects the high-frequency component at the rise. As the rise becomes dull, the frequency of the component will be lower, so that the dielectric loss angle tan δ will less affect the high-frequency component and the signal amplitudes will be almost the same.

$$\begin{aligned} P &= \frac{wl}{d} \omega \varepsilon'' \frac{V_{dd}^2}{2} \\ &= \frac{wl}{d} \omega \varepsilon' \frac{V_{dd}^2}{2} \tan \delta \\ &= \frac{wl}{d} \pi f \varepsilon' V_{dd}^2 \tan \delta \\ &= 2\pi f C V_{dd}^2 \tan \delta \end{aligned} \tag{13}$$

where $P$ indicates a power loss, $w$ indicates a wire width, $d$ indicates a wire spacing, $l$ indicates a wire length, $V_{dd}$ indicates a source voltage, and $C$ indicates a capacity of the entire wire.

When the dielectric loss angle tan δ is zero, a sine wave having a frequency of 15 GHz shows a decay of −2 dB. When tan δ=0.015, the decay will be −3 dB. The attenuation is 2 dB/100 mm, which is a large attenuation.

Figure 22:
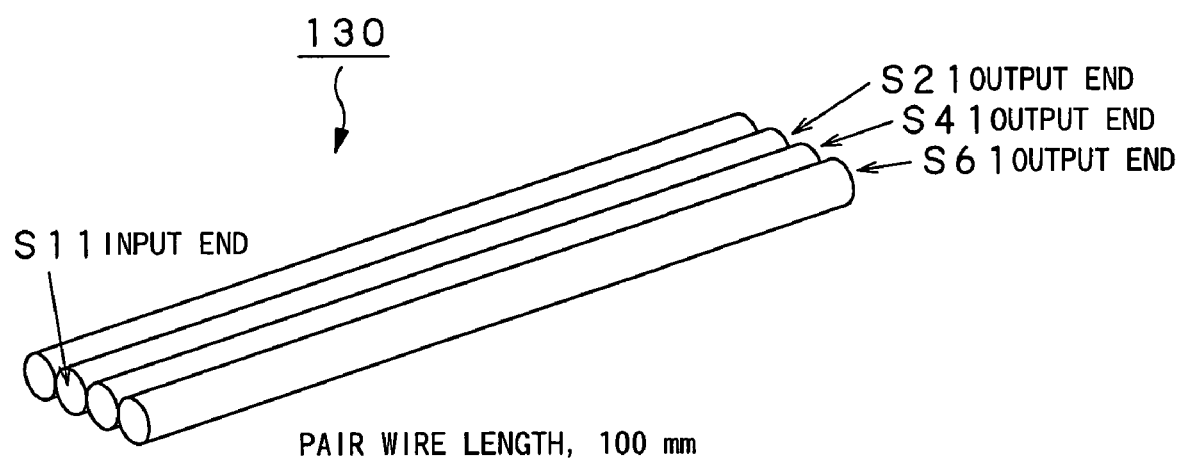
FIG. 22 is a perspective view of a twisted-pair wire.
Figure 23A:
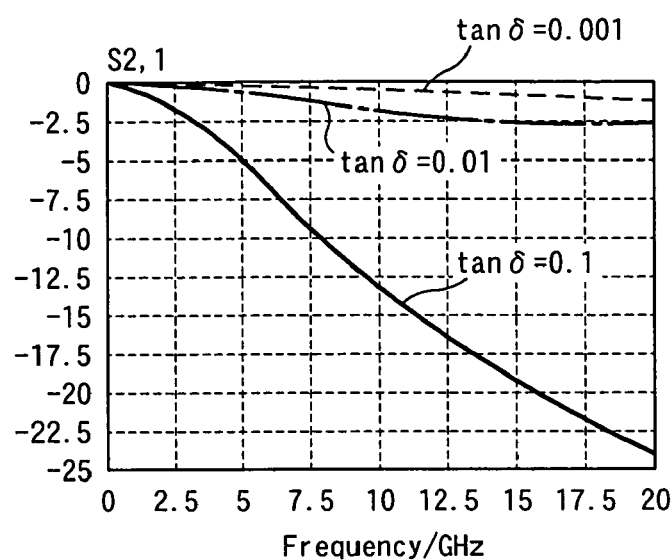
FIG. 23A shows parameters S21 with different dielectric loss angles tan δ
Figure 23B:
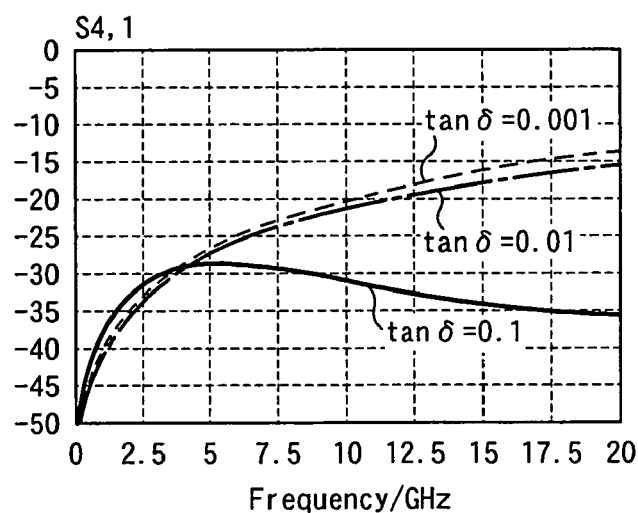
FIG. 23B shows parameters S41 with different loss angles tan δ and FIG. 23C shows parameters S61 with different loss angles tan δ.
Figure 23C:
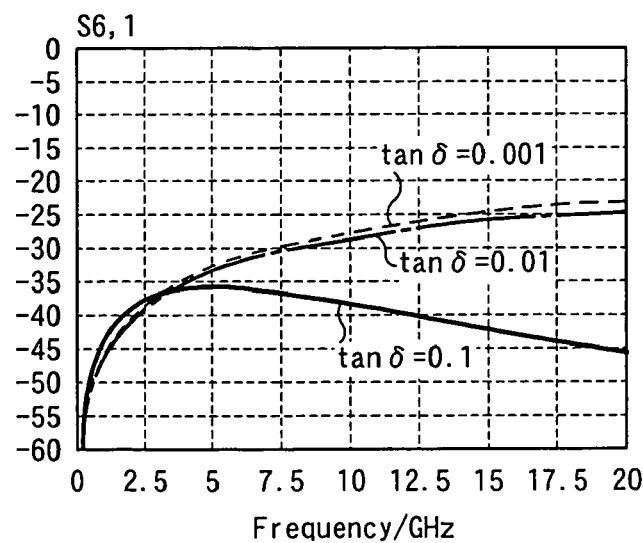

Results of simulation of a transmission characteristic with each dielectric loss angle tan δ, made of a twisted-pair wire 130 as shown in FIG. 22, are shown in FIGS. 23A, 23B and 23C, showing worse results.

It is the most important thing for a long-distance line to reduce the dielectric loss angle tan δ. With tan δ=0.0001, a signal of several GHz (sine wave of 15 GHz) can be transmitted over a distance of 1 meter with a permissible decay of −3 dB.

A pulse wave signal of several GHz (sine wave of 15 GHz) transmitted over a distance of 10 meters with a dielectric loss angle of tan δ=0.0001 will have a decay of −20 dB and retain an energy of ¹⁄₁₀ of the initial one. To reduce the dielectric loss angle tan δ, it has been proposed by way of example to utilize the technique disclosed in the U.S. Pat. No. 6,476,330 and the like. However, a quality transmission line with no crosstalk and electromagnetic radiation permits a receiver to detect the level of a signal with less deformation of the signal waveform. The signal level for transmission will depend upon the relation between the amount of carriers passing through the varactor and capacitive coupler 9 and the load capacity of the receiver. In the case of a pulse of 2 GHz, a requirement for the rise time $t_r$=decay time $t_f$=less than 175 ps has to be met on the assumption that only the energy in the transition region is allowed to pass by the varactor or capacitive coupler 9. Under the conditions for the aforementioned calculation, namely, when the source voltage $V_{dd}$=1 V and $R_{on}$+$R_L$=950+50 Ω, the current $\underline{i}$=1 mA (amplitude of 0.1 V) and the amount of charge Q=175 ps×1 mA=0.175 pC. It is considered that the amount of decay is −20 dB and only 17.5 fC is transmitted to the receiver end. Even on the assumption that the gate capacity of the receiver is estimated to be 15 fF which is somewhat larger than would exactly be and parasitic capacitance is 100 fF (can be attained by a transmission line extending to just before the gate), Q=115 fF×0.1 V=11.5 fC, and the receiver has the voltage thereof increased to a normal one so that sufficient carriers as an energy, which allow the transmission line to be switched between power supply and grounding, can arrive at the receiver.

It is important that the sum of the reflected energy in the transmission line and crosstalk noise should be −20 dB below the level (17.5 cfC) of the reflected energy. The sum will not cause any problem. To reduce the reflected energy to almost zero, the characteristic impedance of the interconnecting wire extending from the driver to the receiver should completely be matched through the connector and substrate viaholes as well.

Figure 24A:
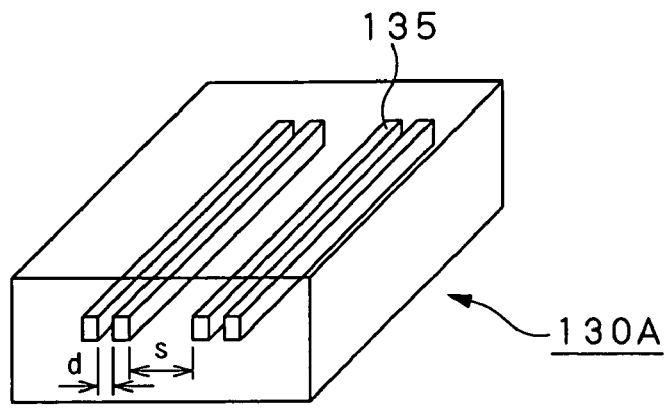
FIG. 24A shows a pair coplanar line.
Figure 24B:
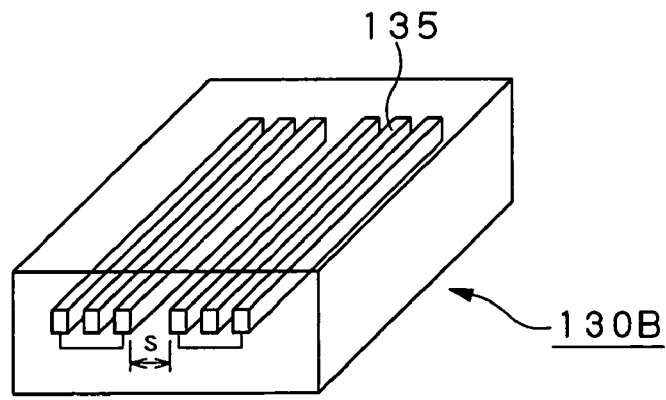
FIG. 24B shows a guard coplanar wire.
Figure 24C:
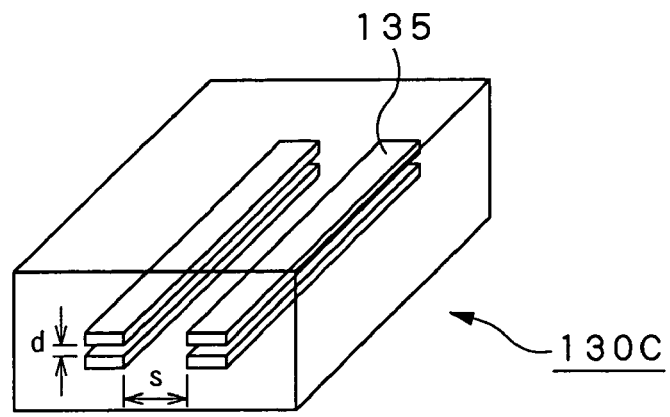
FIG. 24C shows a stacked-pair line and FIG. 24D shows a guard stacked-pair line.
Figure 24D:
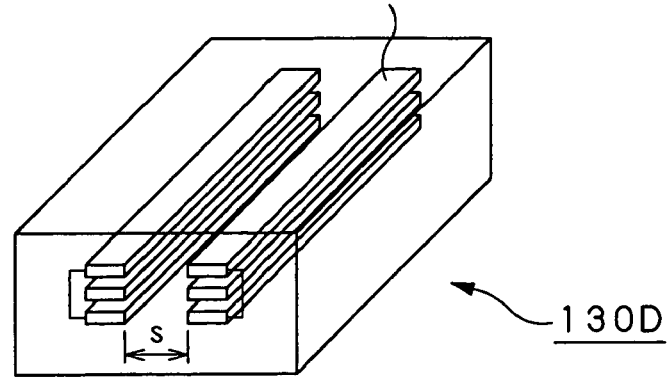

First, a pair coplanar line 130A constructed as shown in FIG. 24A, a guard coplanar line 130B whose opposite ends are used as a common end as shown in FIG. 24B, a stacked-pair line 130C constructed as shown in FIG. 24C or a guard stacked-pair line 130D whose top and bottom are used as a common end as shown in FIG. 24D may be used as a transmission line in addition to the twisted-pair line 130 as shown in FIG. 22. In the examples shown in FIG. 24, the line 130A, 130B, 130C or 130D is laid each in two pairs in a homogenous insulator 135 having the same dielectric constant as that of the lines. Each of such line structures can be formed on a chip and substrate.

For a transmission line structure, it is most important that the structure should definitely be defined as a pair line, and it is secondly important the line is laid in an insulator having the same dielectric constant as that of the line in order to travel a signal without breakdown of the TEM structure.

It is assumed here that as shown in FIG. 24, a line structure meeting the requirement given by the following inequality (14) is taken as a pair line having the above definitely defined structure:

$$3.3wd < ts \qquad (14)$$

where $\underline{d}$ is a space between opposite faces of the pair line, $\underline{w}$ is a width of the opposite-face conductor, $\underline{t}$ is a thickness of the adjacent opposite-face conductor, and $\underline{s}$ is a space between the adjacent lines.

The coupling strength of the pair line is $(1/wd)2$, and that of the adjacent line is $(1/ts)2$. The inequality (14) means that the coupling of the pair line is 10 times stronger than that of the adjacent line. Ten % of a signal energy is a crosstalk, which appears not negligible. However, the crosstalk has no isotropy like that of a cylinder but has a considerable anisotropy which is ruled by the opposite-face coupling, and so it is a crosstalk of less than 5% of the energy.

Next, the connection with a transistor will be explained.

Figure 25:
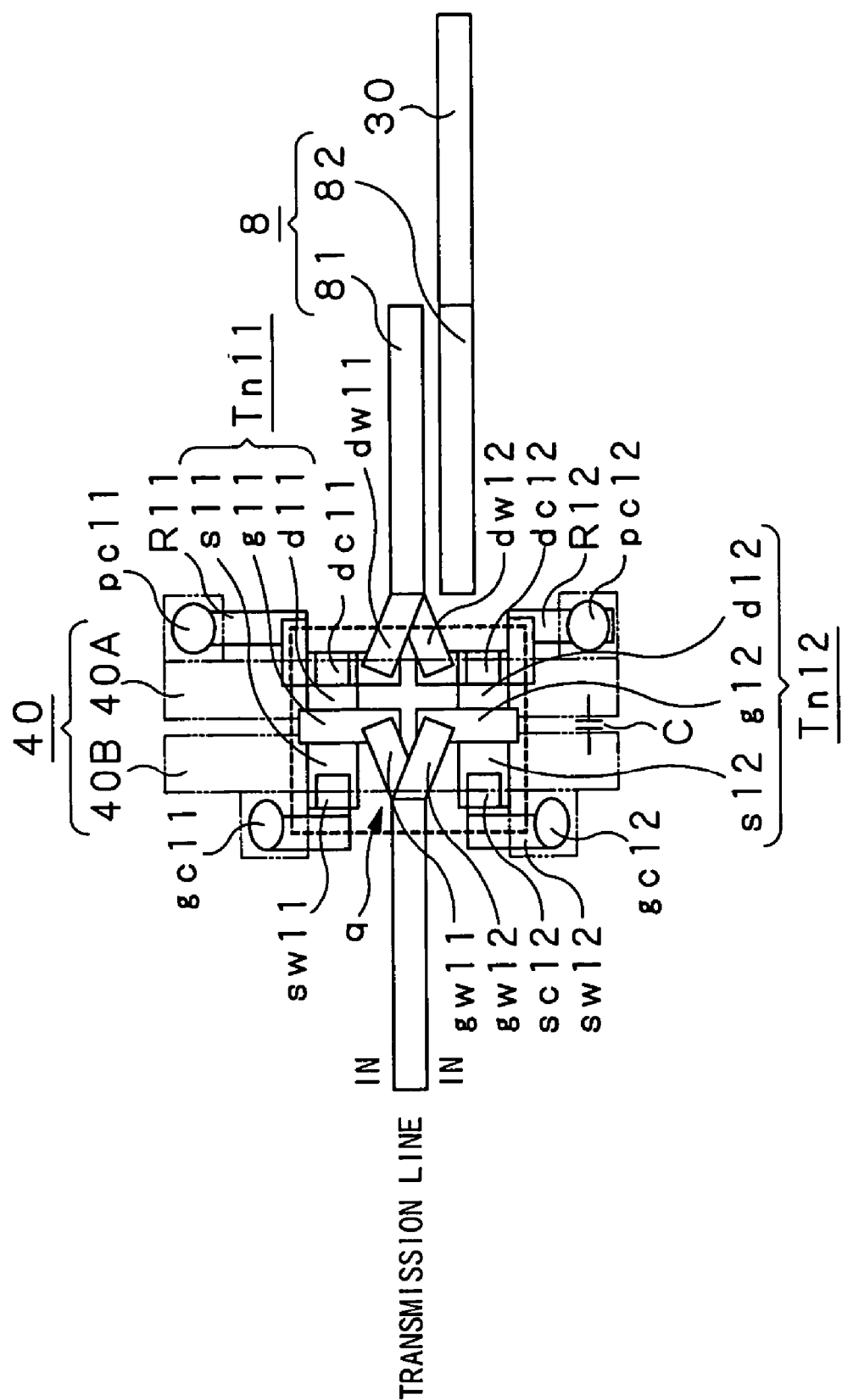
FIG. 25 shows a plan view of a driver used in the signal transmission system shown in FIG. 7.

The flat structure of the driver 4A in the signal transmission system 100A shown in FIG. 7 is shown in the form of a plan view in FIG. 25.

First, a power wire 40A and grounding wire 40B are coplanar to each other and form together a power/ground pair transmission line 40. This power/ground pair transmission line 40 is laid to extend to right above the NMOS transistors Tn11 and Tn12 of the driver 4A. Gate wires gw11 and gw12 form together a stacked-pair line as an input signal line which extends to just short of gates g11 and g12.

The driver 4A has an output line formed from source wires sw11 and sw12 and a grounding wire. The output line is a differential stacked pair line and connected directly to an energy-input pair line 81 of the directional coupler 8. The stacked-pair signal transmission line 30 to which an energy-pass pair line 82 of the directional coupler 8 extends to the receiver 5.

Note here that the power wire 40A, grounding wire 40B, drain contacts dc11 and dc12, source contacts sc11 and sc12, drain wires dw11 and dw12, source wires sw11 and sw12, gate wires gw11 and gw12, power contacts pc11 and pc12, ground contacts gc11 and gc12, directional coupler 8 and signal transmission line 30 are all formed from a metal.

It is important that all the wires except for the electrodes of the transistors Tn11 and Tn12 form the signal transmission line as above. Thus, the signal transmission line can transmit a pulse signal of several tens GHz. More preferably, the gates g11 and g12 should also be formed from a metal.

Figure 26:
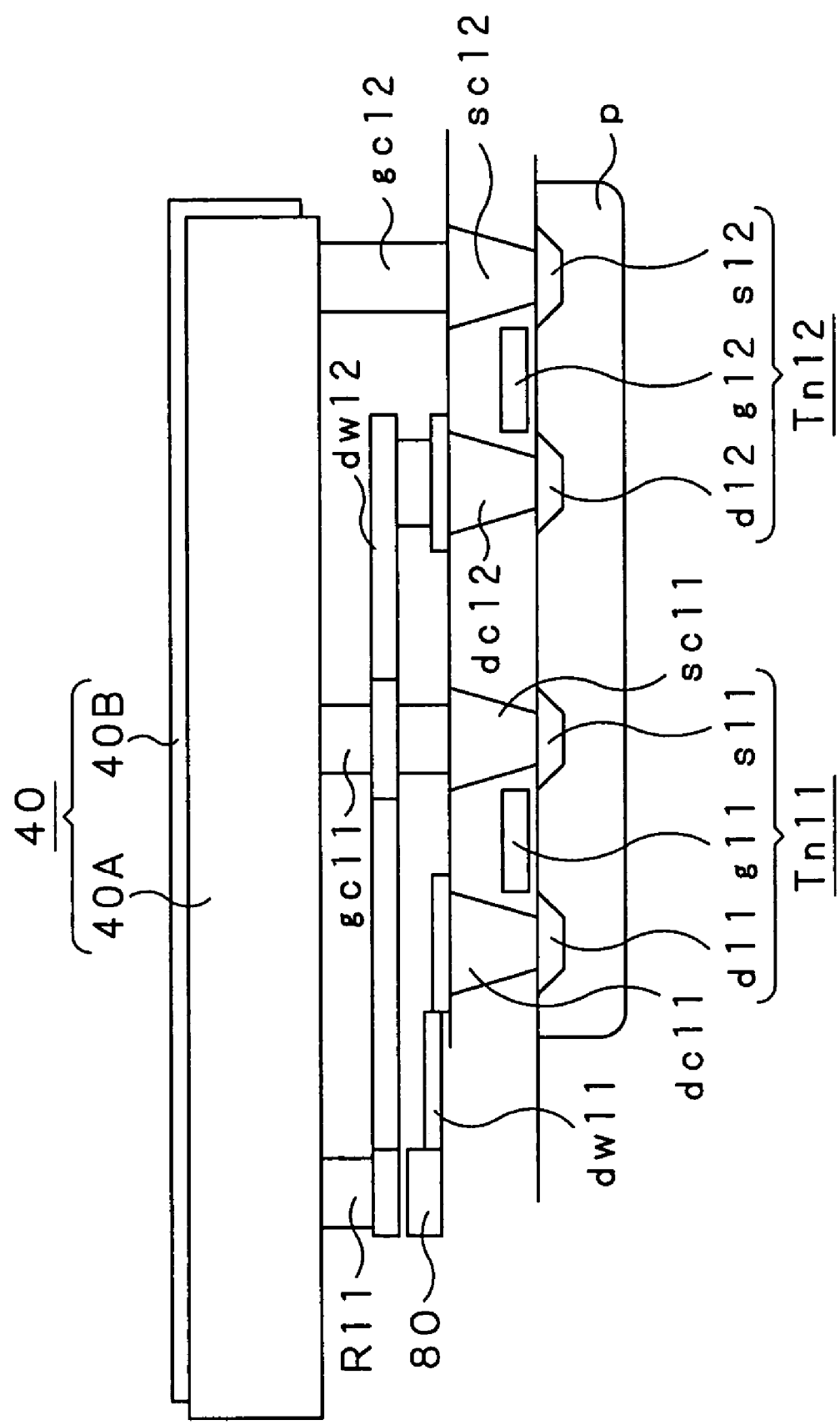
FIG. 26 shows an example of the sectional structure of the driver in FIG. 25.

An example of the sectional structure of the driver 4A is shown in FIG. 26.

The NMOS transistors Tn11 and TN12 included as components in the driver 4A function also as a varactor. They are formed in a P well p1 formed in an N-type layer of a semiconductor substrate or an N-type semiconductor substrate to pump down or up the charges. However, the NMOS transistors Tn11 and Tn12 having also the varactor function are laid longitudinally when viewed in FIG. 25, but laterally when viewed in FIG. 26.

The above NMOS transistors Tn11 and Tn12 functioning also as a varactor have formed in the same P well p1 thereof n-type drain diffusion areas d11 and d12 and n-type source diffusion areas s11 and s12, which form the NMOS transistors Tn11 and Tn12 having the function of a varactor, and have drain contacts dc11 and dc12 connected to the n-type drain diffusion areas d11 and d12, and source contacts sc11 and sc12 and gates g11 and g12, connected to the n-type source diffusion areas s11 and s12. The drain contacts dc11 and dc12 are connected to resistors R11 and R12 and directional coupler 8 via drain wires dw11 and dw12. The resistors R11 and R12 are connected at one end thereof to the drain wires, and at the other end to the power wire 40A via power contacts pc11 and pc12. Also, each of the resistors R11 and R12 is formed from a molybdenum resistor. The source contacts sc11 and sc21 are connected to the source wires sw11 and sw12 and to the grounding wire 40B via the ground contacts gc11 and gc12. Further, the gates g11 and g12 are connected to the gate wires gw11 and gw12, namely, to the signal input transmission line.

Although in this embodiment, the upper power/ground pair transmission line 40 has a coplanar structure, it may have any other structure than the coplanar structure. Also, the gates g11 and g12 may be formed from a polysilicon since they are not at a long distance from the transmission line, but of course they should desirably be formed from a metal electrode in which carriers move fast. In the sectional geometry of the adjacent gates g11 and g12, the insulation layer thickness, and wire width and thickness should be set to meet the aforementioned required relation of 3.3wd<ts. As having already been described, the characteristic impedance of the power/ground pair transmission line 40 should be less than 1/(several times of the characteristic impedance of the output signal transmission line 30).

The structure of viaholes 113 in the substrate is also important. As having been illustrated and described with FIG. 18, the viaholes having the same width as the wire width of the coplanar transmission line extend continuously and contribute to the performance of the transmission line so as to enable transmission of a pulse signal of several GHz with the characteristic as shown in FIG. 19 even if the transmission line includes a wire of 53 mm.

Figure 36A:
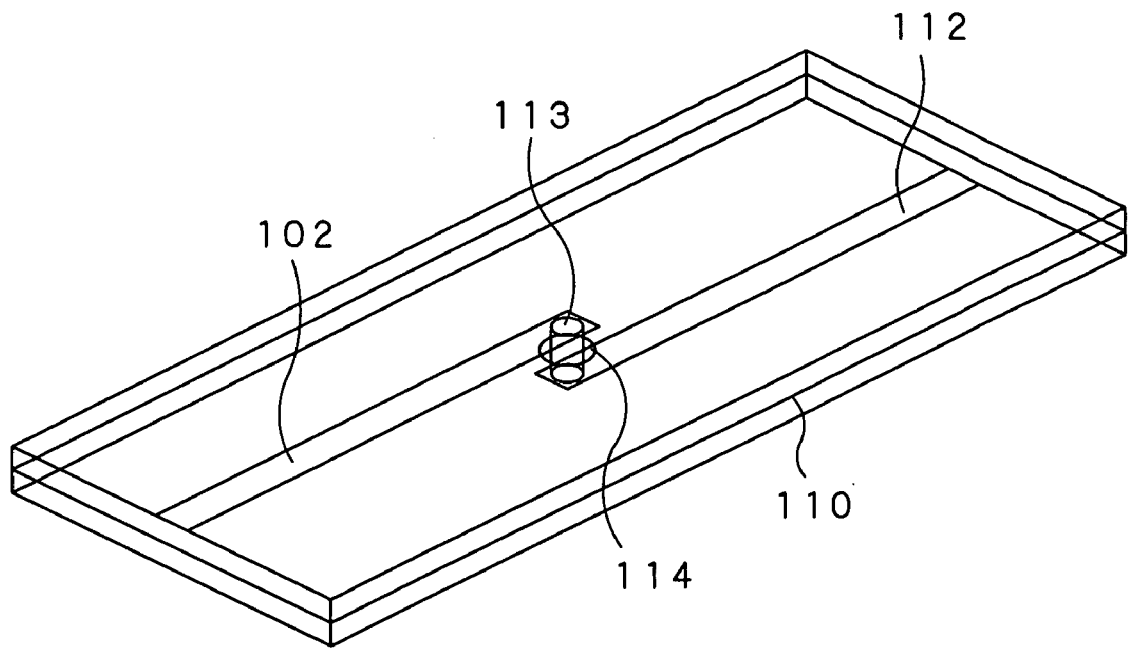
FIG. 36A shows the entire flat grounding wire and FIG. 36B shows the viahole and its near portions as enlarged in scale.
Figure 36B:
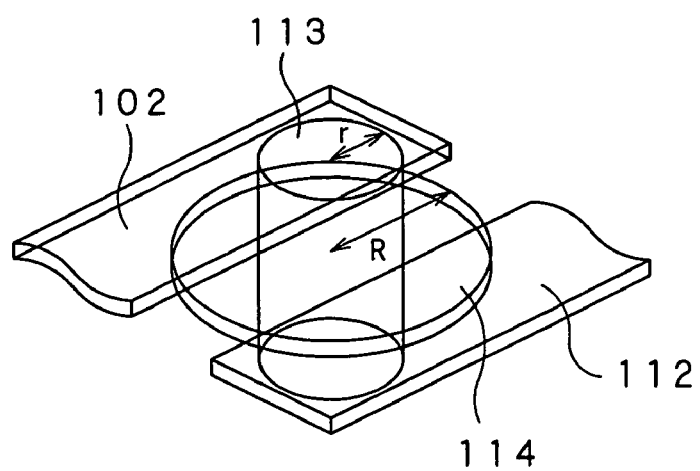
Figure 37:
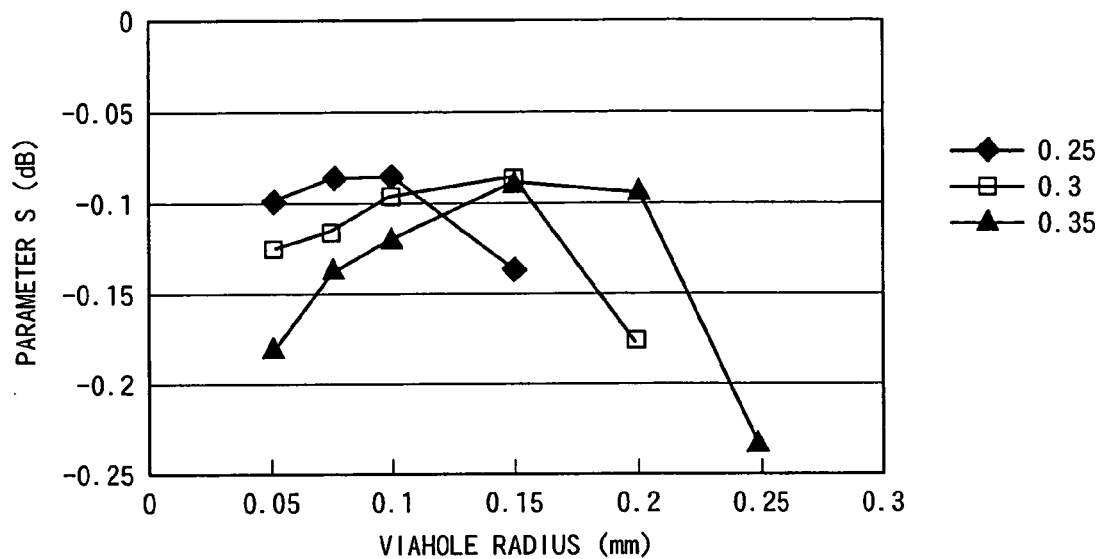
FIG. 37 shows results of simulation of the frequency response of the parameter S21 indicative of a transmission coefficient of the viahole.

A constructional example of the viahole 113 formed in and through a flat grounding wire 110 is illustrated in the form of a perspective view in each of FIGS. 36A and 36B. FIG. 36A shows the entire flat grounding wire having the viahole formed therein, and FIG. 36B shows the viahole portion as enlarged in scale. As shown in FIGS. 36A and 36B, the relation between the radius $r$ of the viahole 113 (of 0.2 mm in length for a wiring length of 50 mm) formed in the flat grounding wire 110 and radius R of an anti-viahole 114 in the flat grounding wire 110 was determined by simulating the frequency response of the parameter S21 representing a transmission coefficient the viahole 113 would have when the anti-viahole radius R was set to each of 0.25, 0.3 and 0.35 mm. Results of the simulation are shown in FIG. 37. As will be seen from FIG. 37, the relation in radius between the viahole 113 and anti-viahole 114 when the radius ratio R/r was 2.0 to 2.5 was found optimum. With this relation, it is possible to allow the pulse of several GHz to pass by the viahole.

Further, the sum of a reflected energy and crosstalk noise in the transmission line will be a problem. The crosstalk will further be discussed below.

Figure 27A:
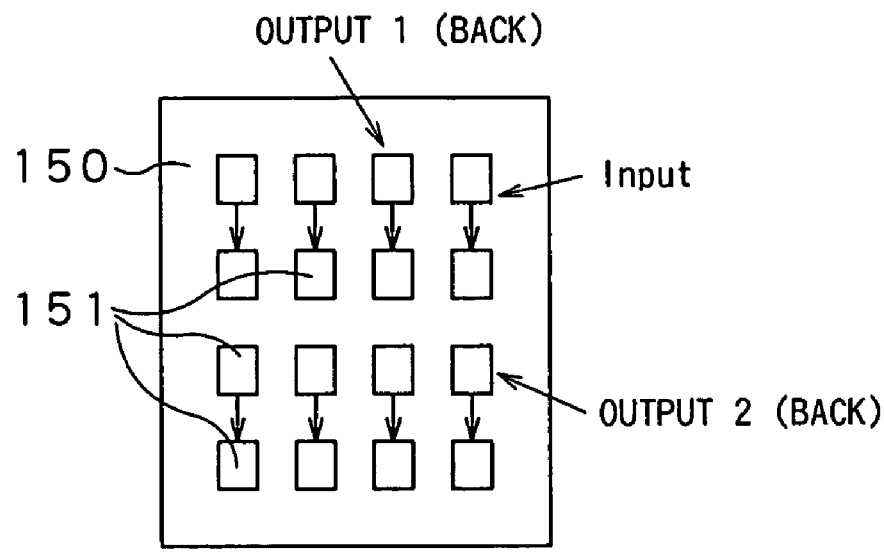
FIG. 27A shows an example of lower-stage vertical wiring and FIG. 27B shows an example of lower-stage orthogonal wiring.
Figure 27B:
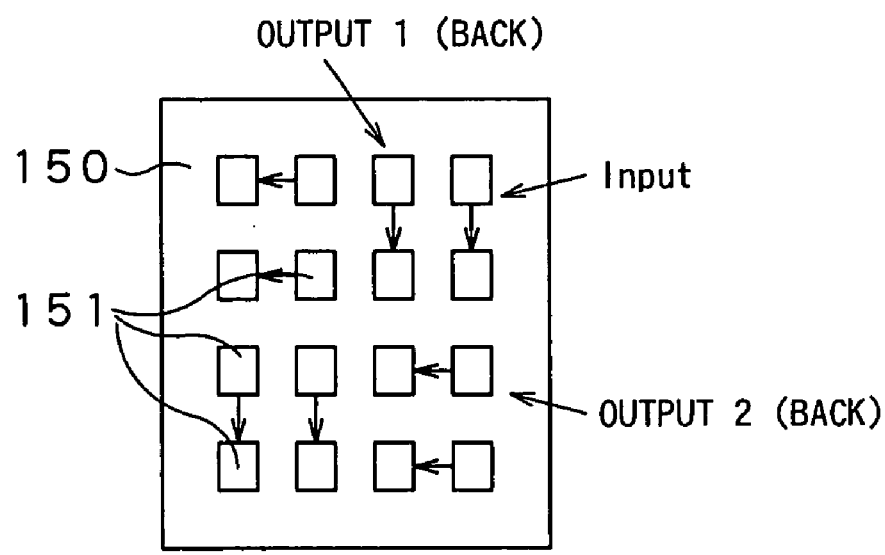
Figure 28:
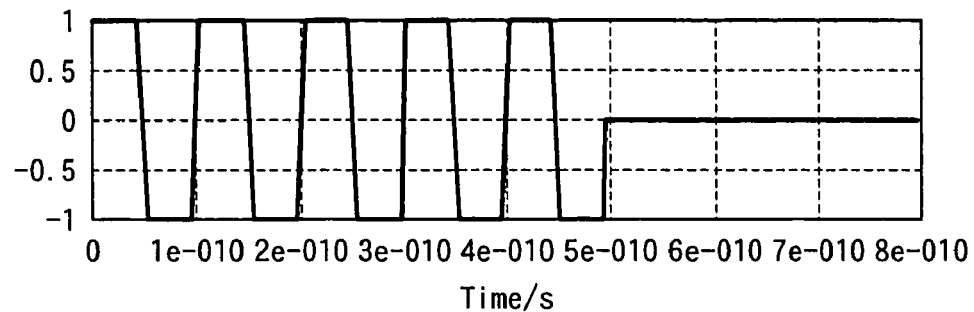
FIG. 28 is a waveform chart of a high-frequency pulse used to observe a crosstalk between adjacent pair wires.
Figure 29A:
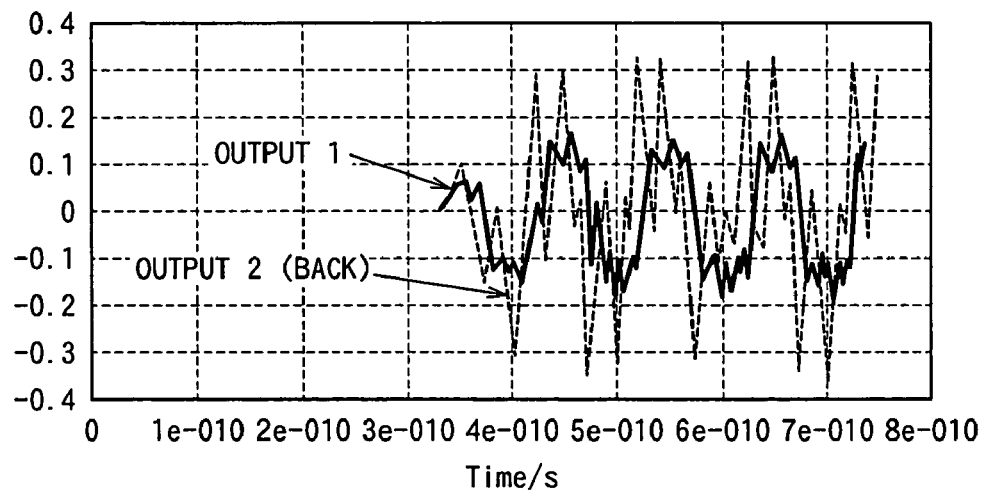
FIG. 29A shows characteristic curves resulted from the vertical wiring in FIG. 27A
Figure 29B:
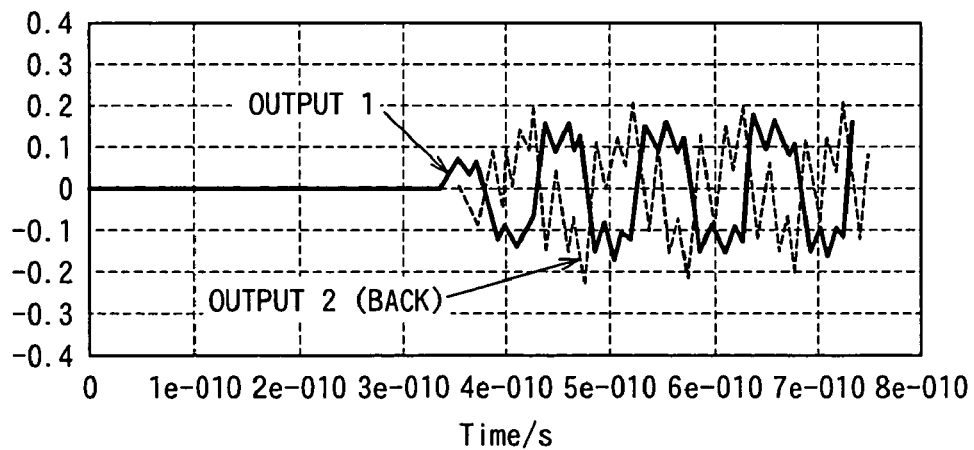
FIG. 29B shows characteristic curves resulted from the orthogonal wiring in FIG. 27B.

In the experiments, conductors 151 of 50 mm in length and 10 μm in sectional area were laid at intervals of 10 μm on a dielectric substrate (FR-4) 150 made of a glass epoxy resin having a specific dielectric constant ∈r being 4.8, and the adjacent conductors were combined together as a pair to provide two different patterns of wiring, as shown in FIGS. 27A and 27B. A high-frequency pulse whose rise time $t_r$ and decay time $t_f$ were both 5 ps and which had a frequency of 10 GHz and a waveform as shown in FIG. 28 was supplied to the conductors, and a crosstalk between the adjacent pair conductors was measured. Results of the measurement are shown in FIGS. 29A and 29B. In the experiment, the direction in which the high-frequency pulse was supplied is perpendicular to the front surface of the drawing, and a crosstalk was measured at Outputs 1 and 2 at the back surface of the drawing. It should be considered here that the Outputs 1 and 2 are at a distance of 50 mm from the front side of the drawing. From the experiment results, it will be seen that the crosstalk from the conductors paired in a topbottom relation as shown in FIG. 29A is larger than that the conductors paired in an orthogonal relation as shown in FIG. 25B.

For the information transmission system according to the present invention, characterized in that the adjacent paired wires are to be in a relation of 3.3wd<ts, the above experimental structure of the wiring can of course be used to make an approach to the crosstalk problem.

The reason for the above will be described below with reference to FIG. 30.

Figure 30A:
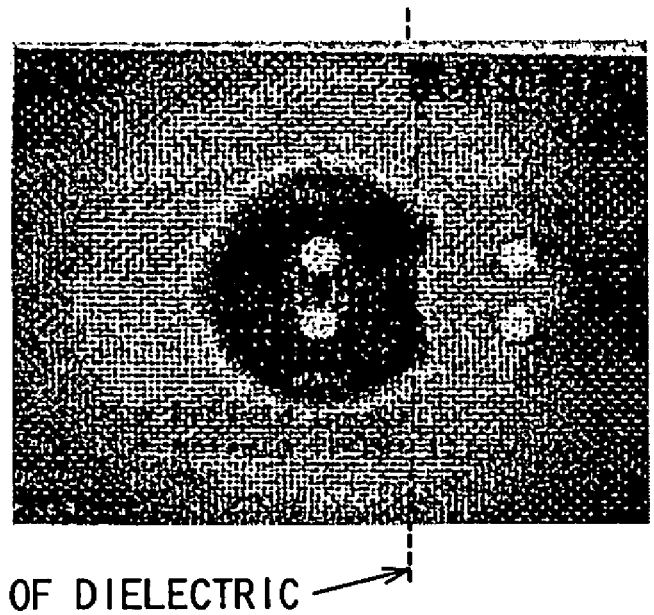
FIG. 30A shows an electric field orthogonal to the array of adjacent pair wires (in an array of adjacent pair wires for parallel field) and FIG. 30B shows an electric field spreading in the direction of the array of adjacent pair wires.
Figure 30B:
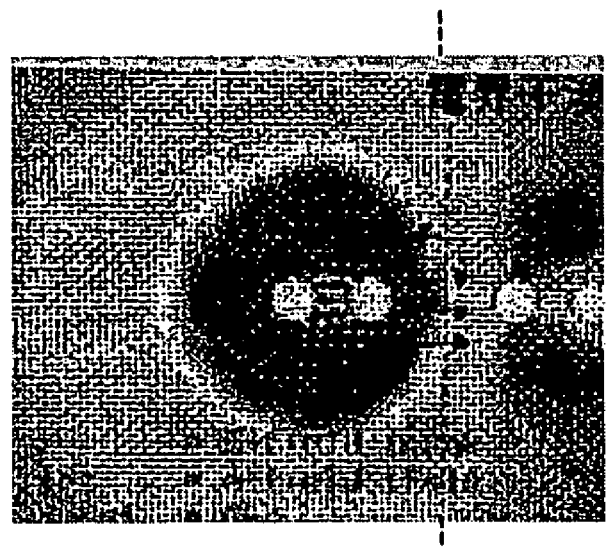

FIGS. 30A and 30B show the spreading of an electric field having a circular section. The direction of the electric field E is indicated with an arrow, and the boundary surface BS of a dielectric material is indicated with a broken line. The electric field leaks to the adjacent paired wires more easily in a field-parallel arrangement in which the direction of the electric field is orthogonal to that of the adjacent paired wires (as shown in FIG. 30A) than in case the electric field and the adjacent paired wires are directed in the same time (as shown in FIG. 30B). Namely, the field energy will leak through a path, if any. A magnetic field will not show such a phenomenon since it has no break in relation to a line of current, which will also be seen in the results of crosstalk measurement as shown in FIG. 29.

There will arise no critical problems as far as the requirement for 3.3 wd<ts is met. For further less crosstalk, any one of the structures as shown in FIGS. 31A to 31F should preferably be adopted.

Figure 31A:
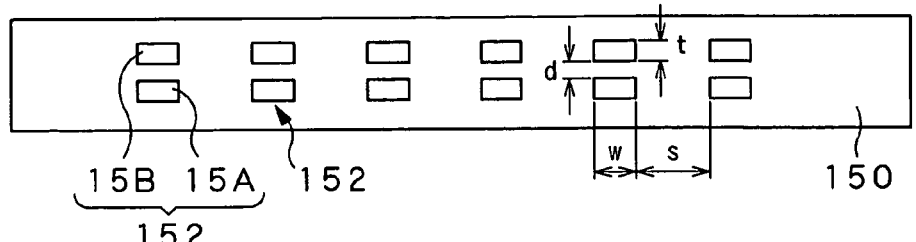
FIG. 31A shows a basic array of pair wires.

FIG. 31A shows a basic field-parallel structure. Conductors 151A and 151B having a thickness $t$ and width W form a pair line 152. The conductors 151A and 151B included in the pair line 152 are laid with a space $d$ between them and the pair lines 152 themselves are laid with a space $s$ between them. The pair lines 152 are laid orthogonal to the direction of the electric field to provide a field-parallel structure. In this case, the requirement for 3.3 wd<ts may not strictly be met, but the coefficient in the required relation should desirably be larger than 2.

Figure 31B:
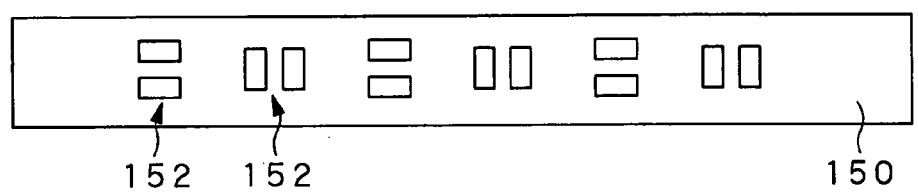
FIG. 31B shows a pair wire array for orthogonal field.

FIG. 31B shows a field-orthogonal structure in which a pair line 152 is laid for field directions to be orthogonal to each other.

Figure 31C:
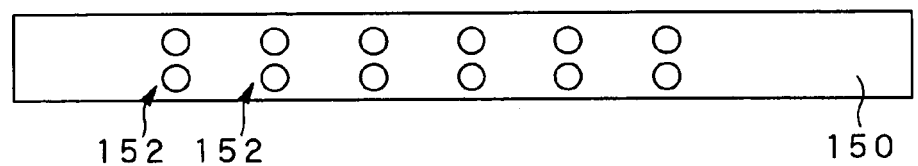
FIG. 31C shows a pair wire array for parallel field.

FIG. 31C shows another field-parallel structure in which the pair line 152 is formed from wires with a consideration given to the convenience in production of the transmission line and the wires are laid to meet a requirement for t≈w. The characteristic impedance may be adjusted by changing the dimension $d$. This construction can provide a pair line of one layer or more than one layer.

Figure 31D:
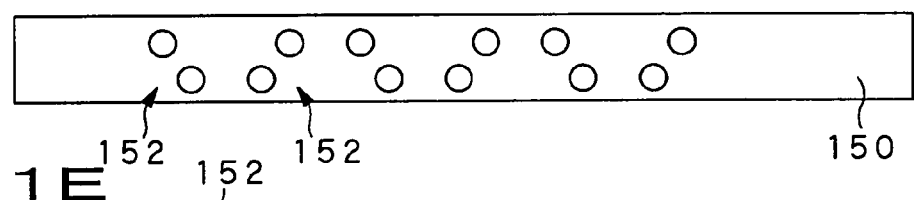
FIG. 31D shows a pair wire array for orthogonal field.

FIG. 31D shows a field-orthogonal structure in which the pair line 152 is formed from wires which can be laid with a high freedom and the wires are laid in directions of 45 deg. to be orthogonal to each other. This line structure can be used to form a flat cable.

Figure 31E:
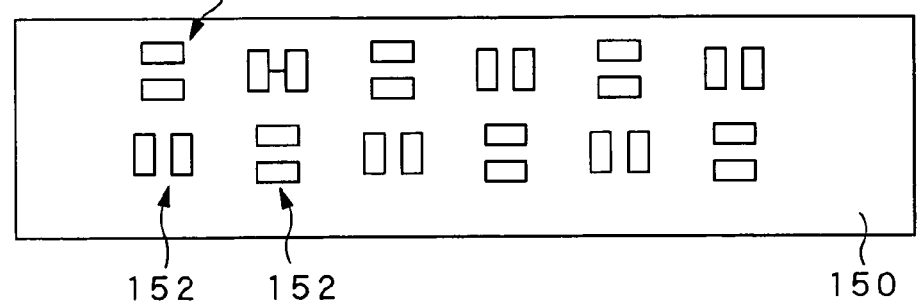
FIG. 31E shows a pair wire array for multi-stage orthogonal field and FIG. 31F shows a pair wire array for square orthogonal field.

FIG. 31E shows a multi-stage field-orthogonal structure in which the field-orthogonal structures shown in FIG. 31B are stacked one on the other.

Figure 31F:
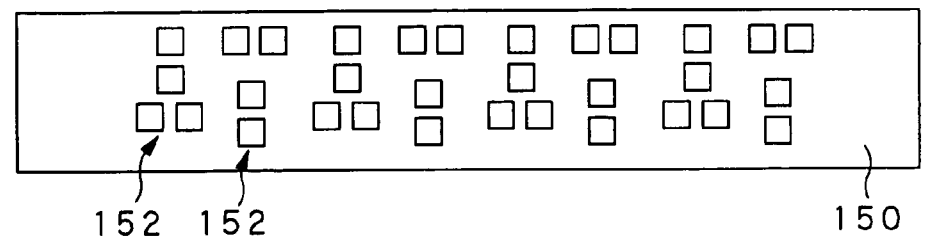

FIG. 31F shows a multi-stage orthogonal structure in which conductors 151A and 151B, shown in FIG. 31E, each having a square section are laid stacked one on the other to form the pair line 152. Of course, the field-orthogonal structure in FIG. 31B can be formed from the pair line 152 including the square conductors 151A and 151B.

As seen from all FIGS. 31A to 31F, the pair line 152 is covered with a homogeneous insulation layer 150 having a thickness larger than $d$ from the outermost surface of the conductors 151A and 151B. This covering insulating layer is essential for maintaining the electromagnetic TEM transmission mode.

Next, the structure of the connector 7 will be described with reference to FIG. 32.

Figure 32:
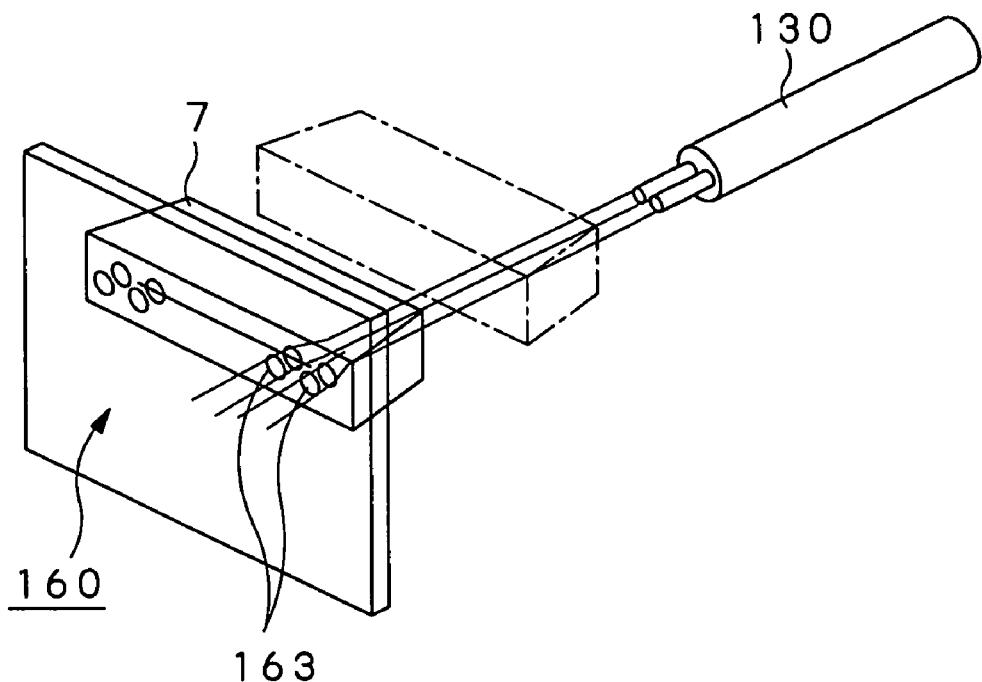
FIG. 32 is a schematic exploded view of a connector.
Figure 33:
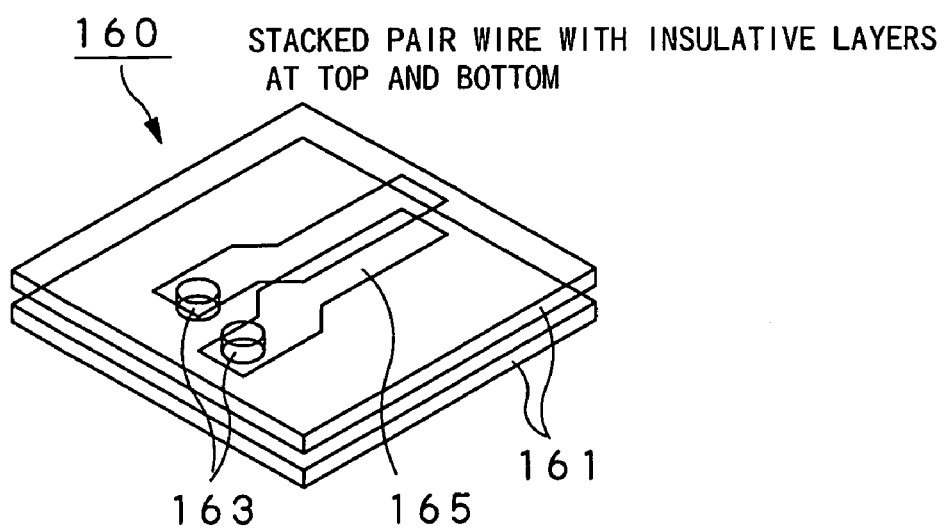
FIG. 33 is a perspective view of a dielectric substrate of the connector in FIG. 32, having a stacked-pair line to which the twisted-pair line is connected.

FIG. 32 shows a construction of the connector 7 which can prevent the disturbance of the characteristic impedance by using the pair line structure as far as possible. In this embodiment, the twisted pair line 130 is used as the signal transmission line 30, and connected at through-holes 163 by the connector 7 to a stacked pair line 165 formed in a three-layer dielectric substrate 160 having upper and lower insulating layers 161 provided on the top and bottom thereof as shown in FIG. 33. In this embodiment, the characteristic impedance is somewhat low only at a clamping spring. Since the clamping spring is about 3 mm or so long and λ/40=3 mm, a pulse of 1.25 GHz or more can pass by the portion of the line with no problem. Because the decrement of the characteristic impedance is 10%, a pulse of 12.5 GHz can pass without any problem. The connector 7 shown in FIG. 32 is to be mounted in a through-hole but it can be surface-mounted.

Further, there will be illustrated and described the connection of the flat ground in the functional block 2 and the input/output block 3 to a differential circuit.

In the conventional differential transmission circuit, the ground is formed intentionally formed as shown in FIG. 4. In the differential transmission line 105 shown in FIG. 34A, the characteristic impedance between differential signal lines 101 and 102 is 100Ω, and that between differential signal lines 101 and 102 and the ground 110 is 50Ω. As shown in FIG. 34B, in the signal transmission system 100 as an embodiment of the present invention, there is inserted a ground 110 between differential signal lines 111 and 112, and a differential transmission line 115 is used in which the characteristic impedance between the differential signal lines 111 and 112 and the ground 110 is 50Ω and that between the differential signal lines 111 and 112 is 100Ω for matching with the conventional signal line.

The differential transmission line 115 has the differential signal lines 111 and 112 laid in a Y-shaped arrangement in which the lower wire, namely, the line 112, is extended up to the uppermost layer through a viahole 113, as shown in FIG. 35, to eventually form the conventional transmission line 105. In the conventional transmission line 105, the ground 110 is connected to a ground connection point 107, but the differential transmission line 115 may have or not have the ground 110 connected as in the conventional transmission line 105.

More specifically, in the differential transmission line 115 constructed as above, the ground 110 at the connection point of the stacked pair line formed from the differential signal lines 111 and 112 may be cut arbitrarily, and freely connected to the twisted pair line 130 in a LAN, for example, via the connector, as shown in FIG. 35. In case the differential signal lines 111 and 112 are equal in characteristic impedance to each other, any terminating resistor (against grounding) may not be provided. In the differential transmission line 115 having the above structure, since the electromagnetic field is distributed symmetrically and the ground has always a potential of 0 V, so the above arrangement is possible.

Figure 38:
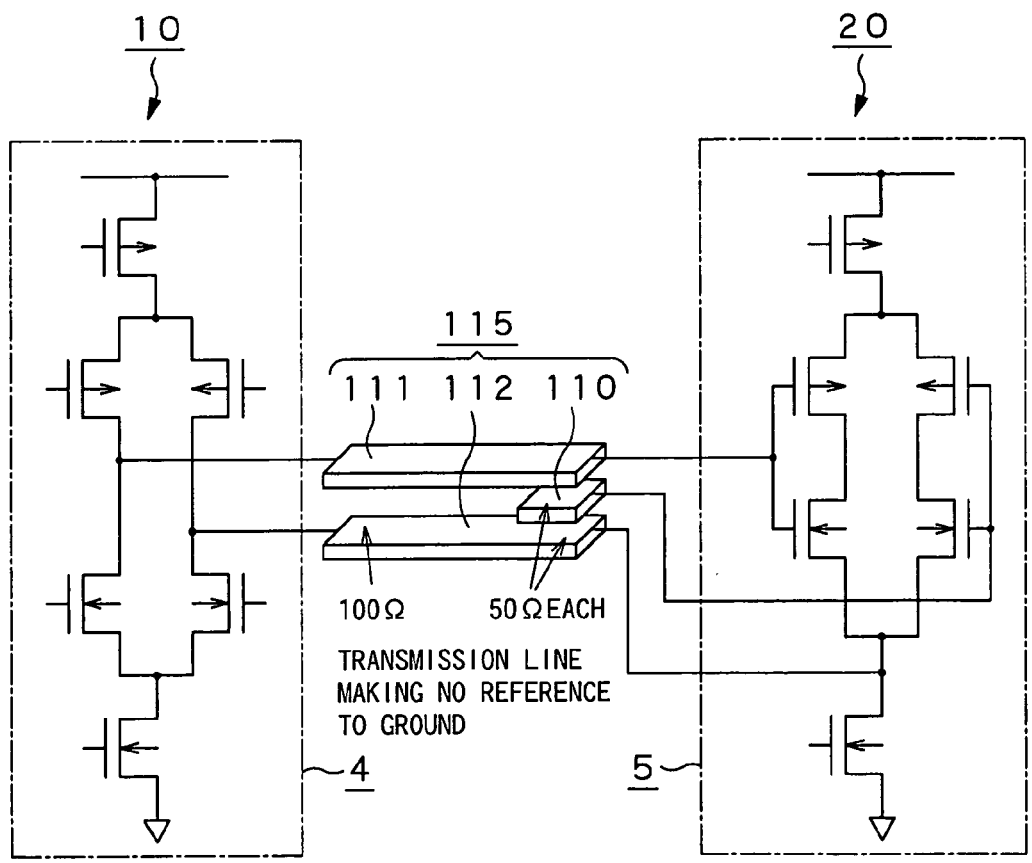
FIG. 38 shows connection between the driver and receiver with a stacked-pair transmission line not referencing to the grounding wire being provided between them.

Although the driver 4 transmits an output signal through stacked pair transmission lines not referring to the ground as shown in FIG. 38, employment of the differential transmission line 115 constructed as above allows the power system of the receiver 5 to be completely independent and also permits to cut off a DC component. To prevent energy reflection in the transmission line, all the driver transistor-on resistors are of 100Ω for transmission at the trailing end. Of course, it is possible to make an adjustment using a damping resistor which is used in many cases. Although a differential signal at the reception end of the receiver has the amplitude thereof halved, the gate capacity is so small that almost all of them will be reflected. Since the signal will thus have a double amplitude, so the same voltage as that of a differential signal having no reference to the 0 level.

Figure 39:
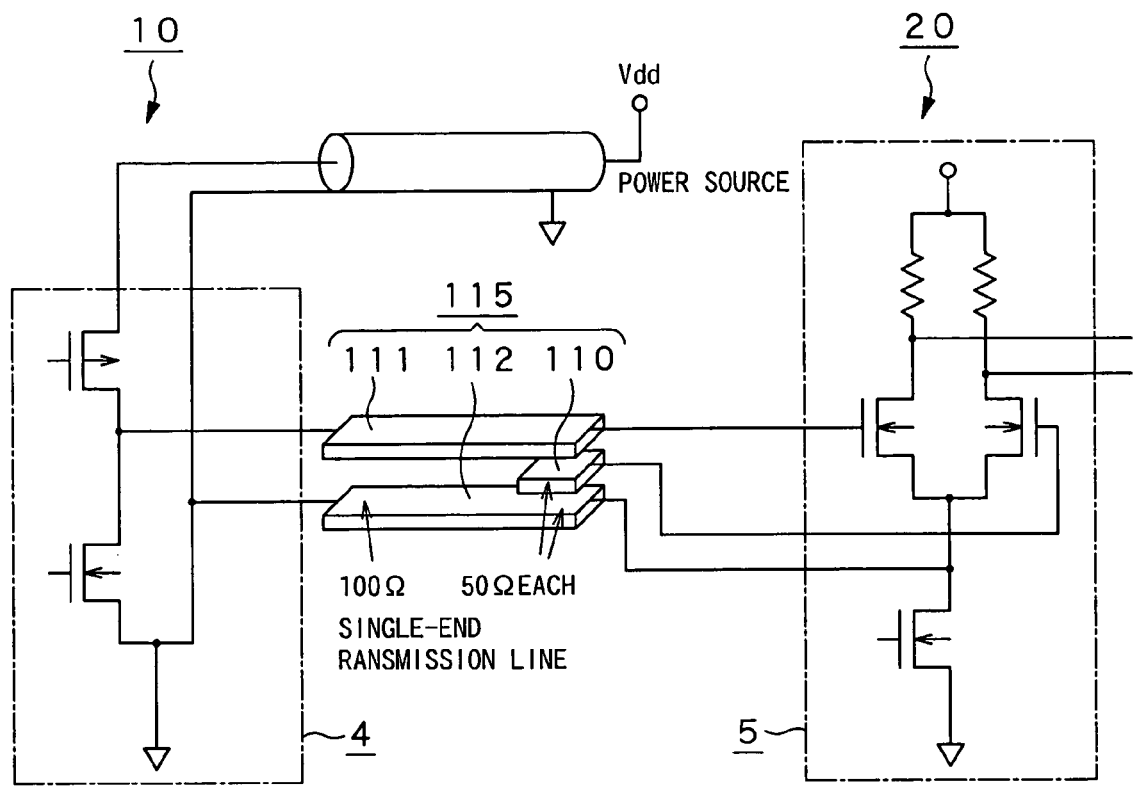
FIG. 39 shows connection between the driver and receiver with a single-ended transmission line being provided between them.

Note that the above arrangement can be adopted between the single-ended driver 4 and receiver 5 as shown in FIG. 39, and the transmission line 115 having the above-mentioned structure can be used as the signal transmission line 30 which provides a connection between the single-ended drive 4 having reference to the ground and the receiver 5 having reference to the 0 level.

Further, the construction of the electrostatic discharge (ESD) protection circuit will be described with reference to FIGS. 40 and 41.

Figure 40:
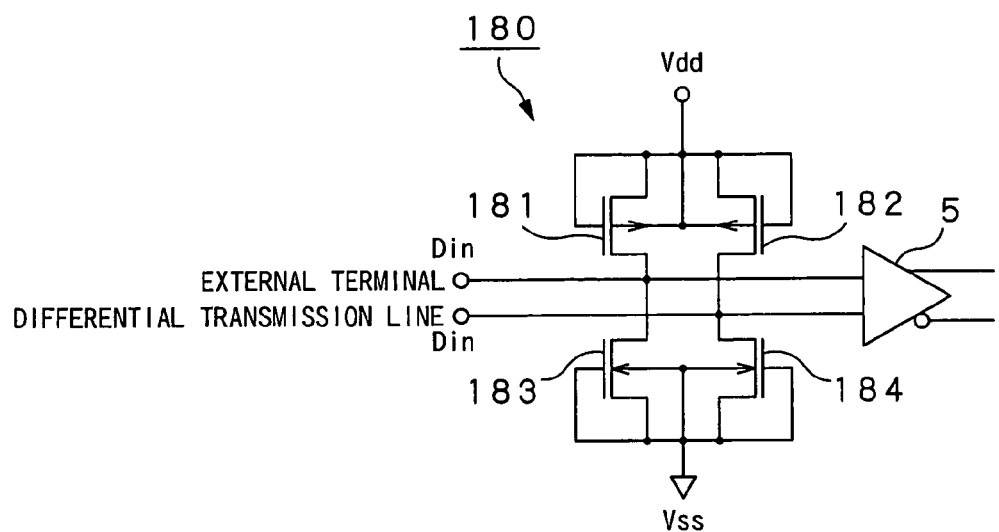
FIG. 40 shows a constructional example of an ESD protection circuit in the form of a circuit diagram.
Figure 41:
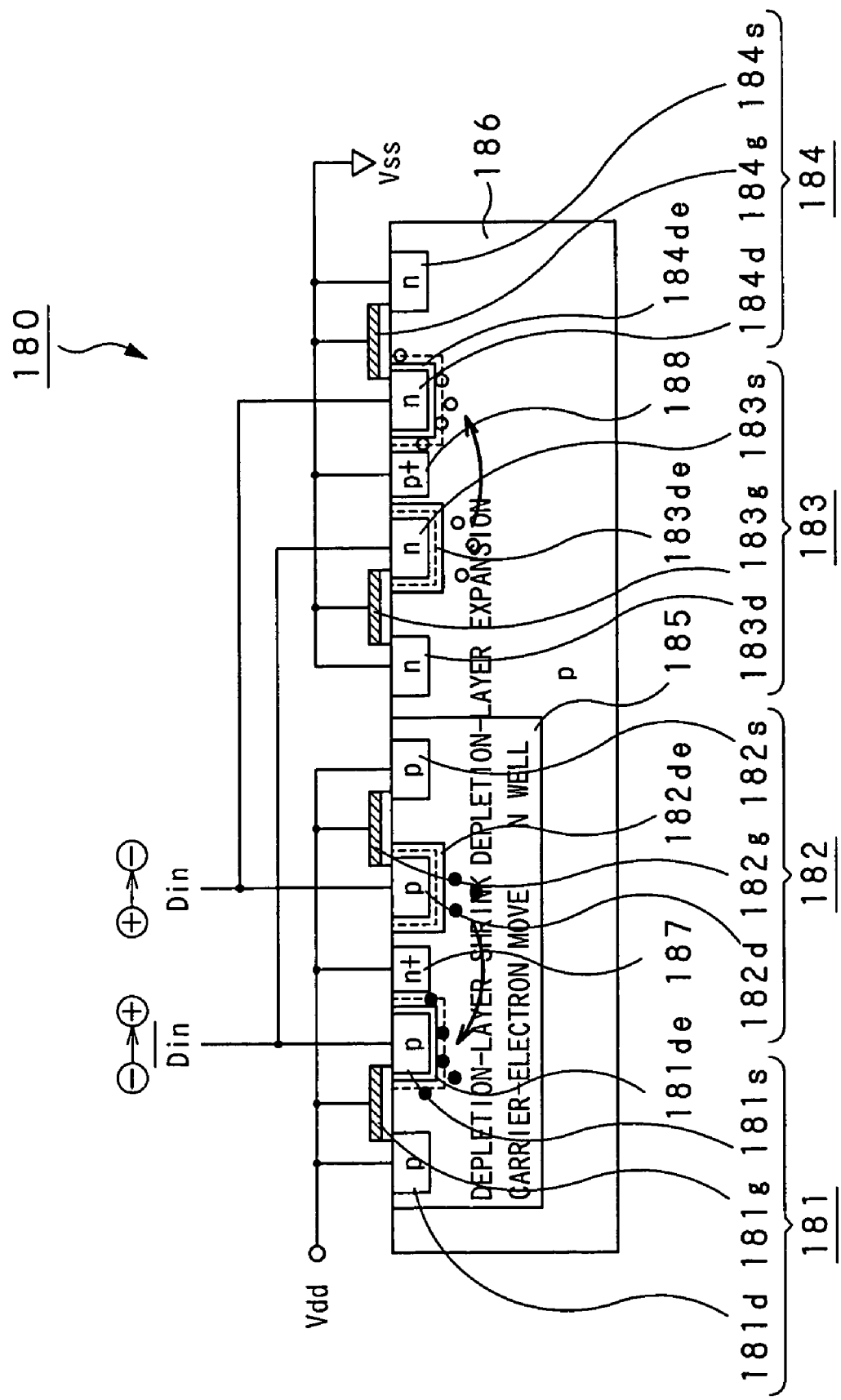
FIG. 41 shows a section of a semiconductor integrated circuit forming the ESD protection circuit in FIG. 40.

In the signal transmission system 100 according to this embodiment, there is provided an ESD protection circuit 180 constructed as shown in FIGS. 40 and 41 between the driver 4 and receiver 5.

The ESD protection circuit 180 is a normal ESD protection circuit as shown in FIG. 40. As shown, the protection circuits for the differential line are laid in pair adjacent to each other within the same conductive structure as shown in the sectional view in FIG. 41 to utilize carriers stored in the p-n junction depletion layer between the drain diffusion layer and substrate up to the capacity of the depletion layer in a complementary manner.

That is, in the ESD protection circuit 180, pMOS transistors 181 and 182 included as components in a pull-up protection circuit for the differential circuit are laid in pair adjacently and in vicinity of each other in an n well 185, and NMOS transistors 183 and 184 included as components in a pull-down protection circuit are laid in pair adjacently and in vicinity of each other in a p-type substrate 186.

The pMOS transistors 181 and 182 included in the pull-up protection circuit for the differential circuit are laid in the same n well 185, and have drains and sources, connected to p-type drain diffusion areas 181d and 182d and p-type source diffusion areas 181s and 182s formed along with an n+ diffusion area 187, in the n well 185, and gates 181g and 182g isolated from the drain and source by an oxide film. The drain and source are connected commonly to $V_{dd}$ and each source is connected to the differential signal transmission line. In the pull-up protection circuit constructed as above, when a differential signal supplied to each source from the differential signal transmission line is turned on and off, depletion layers 181de and 182de formed around the p-type source diffusion areas 181s and 182s vary in thickness in a complementary manner.

Also, the nMOS transistors 183 and 184 included in the pull-down protection circuit for the differential circuit are laid in the same p-type substrate 186, and have drains and sources connected to n-type drain diffusion areas 183d and 184d and n-type source diffusion areas 183s and 184s, formed along with a p+ diffusion area 188 in the p-type substrate 186, and gates 183g and 184g isolated from the drain and source by an oxide film. The gate and source are connected commonly to $V_{dd}$ and each drain is connected to the differential signal transmission line. The drain and drain are connected commonly to $V_{dd}$ and each source is connected to the differential signal transmission line. In the pull-down protection circuit constructed as above, when a differential signal supplied to each source from the differential signal transmission line is turned on and off, n-type depletion layers 183de and 184de formed around the n-type source diffusion areas 183d and 184d vary in thickness in a complementary manner.

The ESD protection circuit 180 constructed as above is to prevent a signal from being dull by substantially canceling the capacitance of the ESD protection circuit 180 with the use of the fact that each time a differential signal turns on and off, the depletion layer increases in thickness in combination with the electric field (capacitance decreases and charges are released) and decreases in thickness (capacitance increases and charges are absorbed at a diffusion potential of 0.6 V). It is advantageously included in the differential transmission line.

In the foregoing, the present invention has been described in detail concerning certain preferred embodiments thereof as examples with reference to the accompanying drawings. However, it should be understood by those ordinarily skilled in the art that the present invention is not limited to the embodiments but can be modified in various manners, constructed alternatively or embodied in various other forms without departing from the scope and spirit thereof as set forth and defined in the appended claims.

For example, although FIG. 40 shows the receiver 5, the driver 4 may take the place of the receiver 5 with no inconvenience.

Since the aforementioned transmission line structures minimize the transfer (crosstalk) of energy to an adjacent line and allow high-frequency components to pass by the directional coupler 8 and coupling capacitor 9, the energy reflection can be minimized so that the heat energy attenuation is limited to that due to the dielectric loss angle tan δ of the insulation material around the middle-distance wire and that due to a DC resistance. Thus, there can be implemented an ideal transmission system without any electromagnetic radiation.

The aforementioned signal transmission system 100 as the embodiment of the present invention is formed from a combination of various elements. However, it is necessary to make an integrated designing of various component elements for transmission of a signal of several tens GHz, and selection of such component elements for the integrated designing is important.

Note that for the signal transmission system 100 as the embodiment of the present invention, it is defined that a plurality of transmission lines be used. However, a single transmission line may be used in place of the plurality of transmission lines, and many lines such as 64 lines, 128 lines or the like may be laid in parallel in the form of a bus structure. In addition, an insulation material containing air bubbles, such as a foamed material, may be adopted to limit the dielectric loss angle tan δ to a level of 0.0001.

What is claimed is:

1. A signal transmission system which transmits a digital signal between circuit blocks via a signal transmission line, comprising:
   in each circuit block, a functional circuit and a separate reception/transmission circuit;
   a power ground pair transmission line comprising a differential line referring to ground, led out from a differential output driver, and formed from differential signal lines disposed symmetrically with respect to ground in the circuit block; and
   at least one differential signal transmission line comprising differential pair lines not referring to ground, and disposed symmetrically with respect to ground, wherein,
   the differential signal transmission line is impedance-matched and extends between separate reception/transmission circuits of said circuit blocks,
   the reception/transmission circuits include a driver and/or receiver having formed in the same conductive area thereof an electrostatic discharge (ESD) protection circuit having a pull-up protection circuit and pull-down protection circuit, respectively, for each differential signal line, and which activates an ESD protection transistor in a complementary manner, and
   each end of the differential pair lines is a floating, open end and a grounding wire of a directional coupler or capacitor just after a driver chip, and that just before or after a receiver chip is not connected directly to the ground.

2. The system according to claim 1, wherein the signal transmission line has a multi-core cable structure in which adjacent differential or single-ended pair lines are laid so that electric field vectors they generate will go side by side or straight.

3. The system according to claim 1, wherein the reception/transmission circuit including a power/ground pair transmission line has at least one of a reception circuit or transmission circuit, both included in the reception/transmission circuit, embedded in a connector to supply a power from a substrate.

4. The system according to claim 1, wherein:
   the reception/transmission circuit includes a driver having a differential inverter structure which outputs a digital signal;
   the reception/transmission circuit is extended to a main power circuit or proximity bypass capacitor, and has a DC-insulation structure in which the driver is supplied with a power via a power/ground pair line having a low characteristic impedance and capable of driving a sum of characteristic impedance of an on resistor of the driver and the signal transmission line and a directional coupler or capacitor is inserted at least either just after the driver or at the reception end; and
   in case the reception/transmission circuited is further extended by a transmission line, if any, a digital signal for transmission via the signal transmission line terminated in the traveling direction of the directional coupler or capacitor is received by a differential receiver having a Vth corresponding to the level of an arriving signal just after or before the directional coupler or capacitor.

5. The system according to claim 1, wherein a transistor to be in pair with the differential driver or receiver is provided in the same well and it has a floating structure without connection to the substrate ground, wherein the signal transmission lines are formed from a metal.

6. The system according to claim 1, wherein a set of a power/ground pair line, driver, signal transmission line and a receiver is provided bidirectionally.

7. The system according to claim 4, wherein an energy-pass side line of the directional coupler or capacitor has a multireflection-preventive terminating resistor inserted at the transmission trailing end thereof.

8. The system according to claim 1, wherein an electrode is inserted between the differential pair lines at the end of a receiver which receives a digital signal via the signal transmission line, and the potential at the electrode is taken as a reference voltage.

9. The system according to claim 1, wherein:
   in case the reception/transmission circuit in one of the circuit blocks that transmits a digital signal via the signal transmission line has no power source, power/ground pair transmission lines run side by side; and
   the characteristic impedance of the power/ground pair transmission lines is equal to or smaller than a parallel impedance of a plurality of signal transmission lines to be driven.

* * * * *